United States Patent
Chien et al.

(10) Patent No.: US 11,756,962 B2
(45) Date of Patent: *Sep. 12, 2023

(54) SEMICONDUCTOR DEVICE

(71) Applicant: Taiwan Semiconductor Manufacturing Company, Ltd., Hsinchu (TW)

(72) Inventors: Yu-San Chien, Hsinchu (TW); Chun-Sheng Liang, Changhua County (TW); Jhon-Jhy Liaw, Hsinchu County (TW); Kuo-Hua Pan, Hsinchu (TW); Hsin-Che Chiang, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/750,409

(22) Filed: May 23, 2022

(65) Prior Publication Data

US 2022/0278102 A1 Sep. 1, 2022

Related U.S. Application Data

(63) Continuation of application No. 16/899,592, filed on Jun. 12, 2020, now Pat. No. 11,374,006.

(51) Int. Cl.
*H01L 27/092* (2006.01)
*H01L 21/8238* (2006.01)

(52) U.S. Cl.
CPC .. *H01L 27/0924* (2013.01); *H01L 21/823821* (2013.01); *H01L 21/823878* (2013.01)

(58) Field of Classification Search
CPC ......... H01L 27/0924; H01L 21/823821; H01L 21/823878; H01L 21/823431; H01L 27/0886; H01L 29/6681; H01L 21/823437; H01L 21/823481
See application file for complete search history.

(56) References Cited

U.S. PATENT DOCUMENTS

| | | | |
|---|---|---|---|
| 8,836,016 | B2 | 9/2014 | Wu et al. |
| 8,841,701 | B2 | 9/2014 | Lin et al. |
| 8,847,293 | B2 | 9/2014 | Lee et al. |
| 8,853,025 | B2 | 10/2014 | Zhang et al. |
| 8,962,400 | B2 | 2/2015 | Tsai et al. |
| 9,093,514 | B2 | 7/2015 | Tsai et al. |
| 9,236,267 | B2 | 1/2016 | De et al. |
| 9,245,805 | B2 | 1/2016 | Yeh et al. |
| 9,520,482 | B1 | 12/2016 | Chang et al. |
| 9,576,814 | B2 | 2/2017 | Wu et al. |
| 2019/0067417 | A1* | 2/2019 | Ching ............. H01L 21/823431 |

* cited by examiner

*Primary Examiner* — Karen Kusumakar
*Assistant Examiner* — Adam S Bowen
(74) *Attorney, Agent, or Firm* — JCIPRNET

(57) ABSTRACT

Provided is a semiconductor device including a substrate, one hybrid fin, a gate, and a dielectric structure. The substrate includes at least two fins. The hybrid fin is disposed between the at least two fins. The gate covers portions of the at least two fins and the hybrid fin. The dielectric structure lands on the hybrid fin to divide the gate into two segment. The two segments are electrically isolated to each other by the dielectric structure and the hybrid fin. The hybrid fin includes a first portion, disposed between the two segments of the gate; and a second portion, disposed aside the first portion, wherein a top surface of the second portion is lower than a top surface of the first portion.

20 Claims, 29 Drawing Sheets

SEMICONDUCTOR DEVICE

CROSS-REFERENCE TO RELATED APPLICATION

This application is a continuation application of and claims the priority benefit of a prior application Ser. No. 16/899,592, filed on Jun. 12, 2020, now allowed. The entirety of the above-mentioned patent application is hereby incorporated by reference herein and made a part of this specification.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
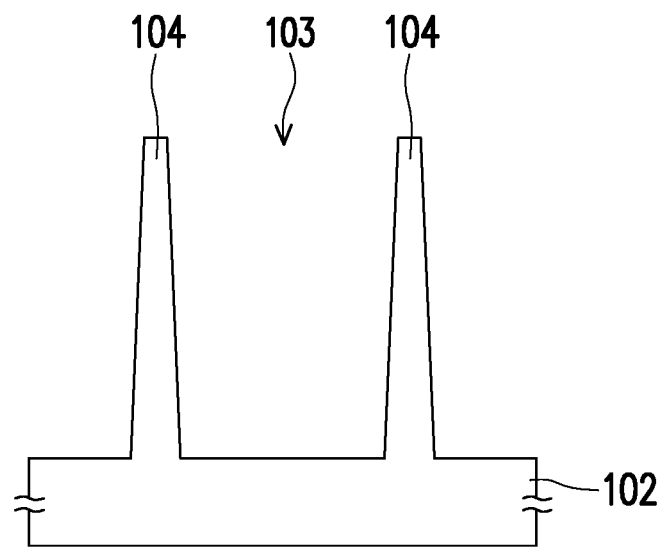
FIG. 1A to FIG. 1K are schematic cross-sectional views illustrating a method for forming a semiconductor device in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

In accordance with some embodiments, a plurality of hybrid fins are disposed between a plurality of fins. A plurality of gate strips cover portions of the fins and the hybrid fins. A plurality of dielectric pillars are disposed in the gate strips and landing on the hybrid fins respectively, so as to divided the gate strips into a plurality of segments. Herein, the dielectric pillars may be referred to as cut-poly (CPO). The segments of the gate strips are electrically isolated by the CPO and the hybrid fins. In the case, the hybrid fins are beneficial to reduce the removing amount of the gate strips for forming the CPO, thereby shrinking the critical dimension of the CPO and increasing chip usage area. In addition, the hybrid fins are disposed between the S/D regions to prevent adjacent S/D regions from merging.

FIG. 1A to FIG. 1K are schematic cross-sectional views illustrating a method for forming a semiconductor device in accordance with some embodiments of the disclosure. The semiconductor device illustrated in the following embodiments may be applied to, but not limited thereto, a fin field-effect transistor (FinFET). In other embodiments, the semiconductor device is also applied to a tri-gate transistor, a gate-all-around (GAA) FET, or other transistors.

Referring to FIG. 1A, a substrate 102 is provided. In some embodiments, the substrate 102 includes a crystalline silicon substrate (e.g., wafer). The substrate 102 may include various doped regions depending on design requirements (e.g., p-type semiconductor substrate or n-type semiconductor substrate). In some embodiments, the doped regions may be doped with p-type or n-type dopants. For example, the doped regions may be doped with p-type dopants, such as boron or $BF_2$; n-type dopants, such as phosphorus or arsenic; and/or combinations thereof. The doped regions may be configured for an n-type FinFET, or alternatively, configured for a p-type FinFET. In some alternative embodiments, the substrate 102 includes an element semiconductor such as silicon or germanium, a compound semiconductor such as silicon carbide, gallium arsenic, gallium phosphide, indium phosphide, indium arsenide and indium antimonide, an alloy semiconductor such as SiGe, GaAsP, AlInAs, AlGaAs, GaInAs, GaInP and GaInAsP or combinations thereof.

Referring to FIG. 1A, the substrate 102 is patterned to form a plurality of trenches 103 and a plurality of fins 104 between the trenches 103. In some embodiments, the fins 104 are patterned as semiconductor strips and separated by the trenches 103. Although only two fins 104 are illustrated in FIG. 1A, the embodiments of the present disclosure are not limited thereto. In other embodiments, the number of the fins 104 may be adjusted by the need, such as one fin, three fins, four fins, or more fins.

Figure 1B:
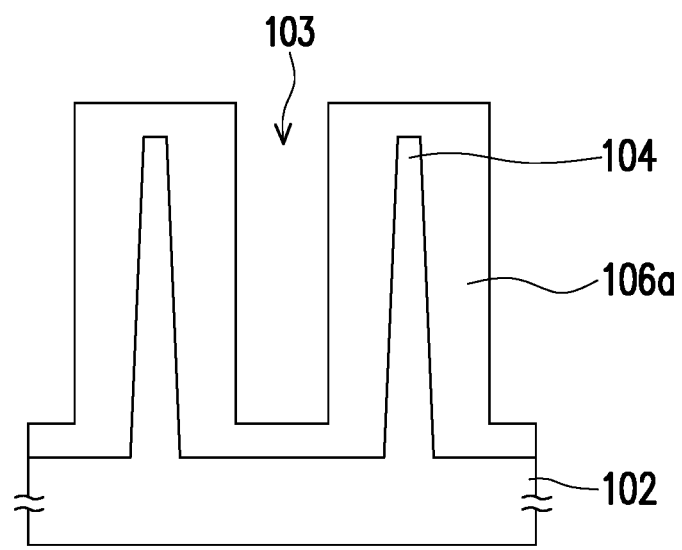

Referring to in FIG. 1B, an insulating material 106a is formed over the substrate 102. In some embodiments, the insulating material 106a conformally covers the fins 104 and the trenches 103. The insulating material 106a may include SiO, SiN, SiON, a spin-on dielectric material, or a low-k dielectric material. Herein, the low-k dielectric materials are generally dielectric materials having a dielectric constant lower than 3.9. The insulating material 106a may be formed by plasma-enhanced chemical vapor deposition (PECVD), atomic layer deposition (ALD), flowable chemical vapor deposition (FCVD), spin on, or the like. In some embodiments, the insulating material 106a has a thickness of about 10 nm to about 13 nm.

Figure 1C:
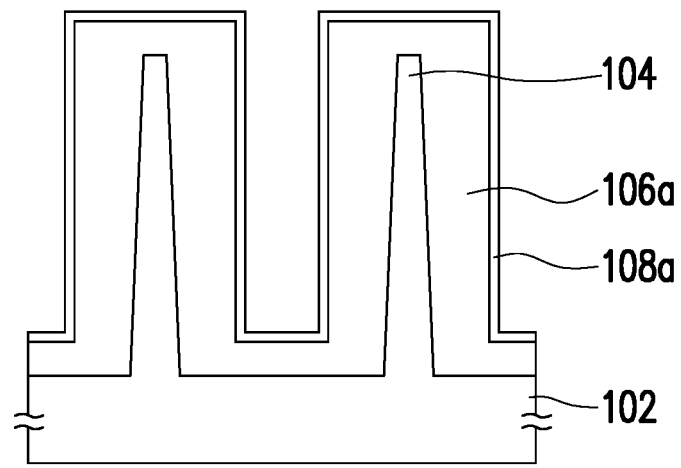

Referring to FIG. 1C, an etch stop material 108a is formed on the insulating material 106a. In some embodiments, the etch stop material 108a conformally covers the insulating material 106a along the profiles of the fins 104 and the trenches 103. The etch stop material 108a may include SiO, SiOC, SiCN, SiC, or a combination thereof, and may be formed by PECVD, ALD, FCVD, or the like. The etch stop material 108a may have a thickness of about 2 nm to about 5 nm. In some other embodiments, the etch stop material 108a has a sidewall thickness less than 3 nm. Alternatively, the etch stop material 108a may be optionally formed. That is, the etch stop material 108a may be not formed on the insulating material 106a.

Figure 1D:
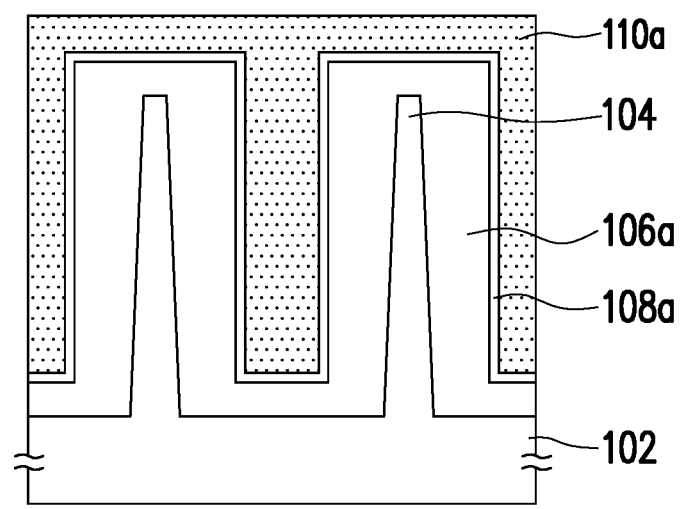

Referring to in FIG. 1D, a first material 110a is formed on the etch stop material 108a. In some embodiments, the first material 110a is filled in the trenches 103. The first material 110a may include a dielectric material having a dielectric constant less than 8, such as SiN, SiO, SiOC, SiON, SiOCN, oxide containing carbon, oxide containing nitrogen, oxide containing carbon and nitrogen, a combination thereof, or other suitable materials. In the embodiments, the first material 110a with the dielectric constant less than 8 is able to reduce the unnecessary parasitic capacitance between two adjacent fins 104.

Figure 1E:
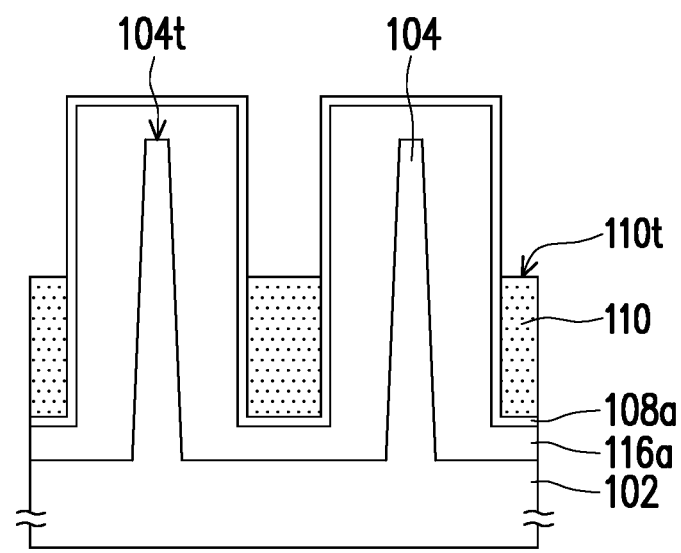

Referring to in FIG. 1D and FIG. 1E, the first material 110a is recessed or etched, so that a top surface 110t of the recessed first material 110 is lower than top surfaces 104t of the fins 104. In some embodiments, the first material 110a and the etch stop material 108a have materials with different etching selectivities. That is, the first material 110a has an etching rate greater than an etching rate of the etch stop material 108a during the recessing or etching. Accordingly, no or only a few of the etch stop material 108a is removed while most of the first material 110a are removed.

Figure 1F:
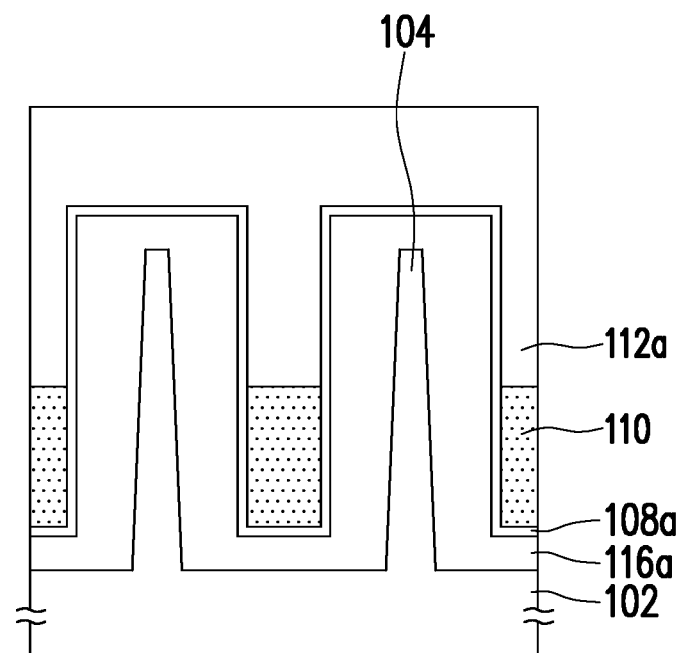

Referring to in FIG. 1F, a second material 112a is formed on the first material 110. In some embodiments, the second material 112a is filled in the trenches 103. The second material 112a may include a dielectric material having a dielectric constant greater than 8, such as metal oxide. The metal oxide may include $HfO_2$, $Ta_2O_5$, $TiO_2$, $ZrO_2$, $Al_2O_3$, $Y_2O_3$, La doped oxide, oxide containing multiple metal, a combination thereof, or other suitable materials. In the embodiments, the second material 112a with the dielectric constant greater than 8 is able to prevent two adjacent S/D regions 140 (as shown in the following FIG. 7B) from merging.

Figure 1G:
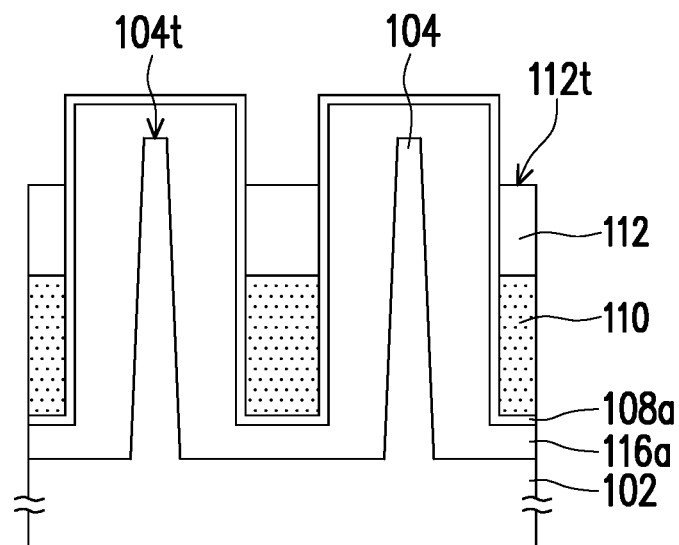

Referring to in FIG. 1F and FIG. 1G, the second material 112a is recessed or etched, so that a top surface 112t of the recessed second material 112 is lower than the top surfaces 104t of the fins 104. In some embodiments, the second material 112a and the etch stop material 108a have materials with different etching selectivities. That is, the second material 112a has an etching rate greater than the etching rate of the etch stop material 108a during the recessing or etching. Accordingly, no or only a few of the etch stop material 108a is removed while most of the second material 112a are removed.

Figure 1H:
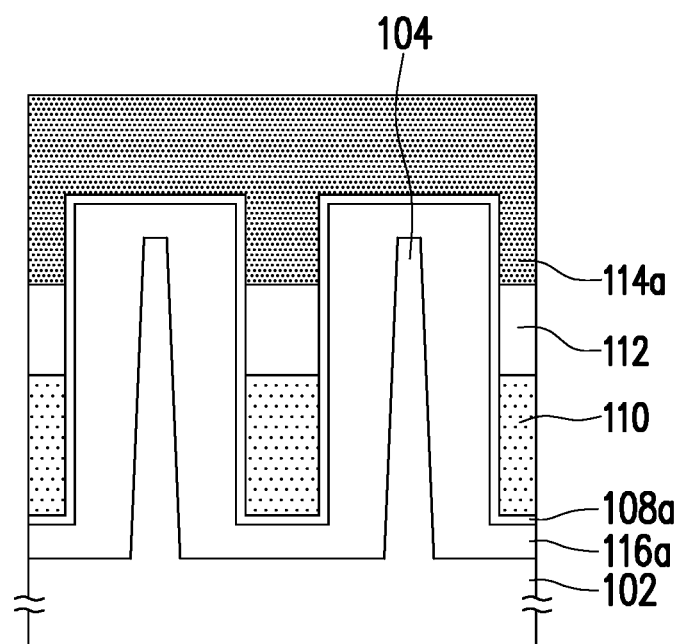

Referring to in FIG. 1H, a third material 114a is formed on the second material 112. In some embodiments, the third material 114a is filled in the trenches 103. The third material 114a may include a dielectric material having a dielectric constant less than 7, such as SiO, SiOC, SiON, SiOCN, a combination thereof, or other suitable materials. In the embodiments, the third material 114a with the dielectric constant less than 7 is able to reduce the unnecessary parasitic capacitance between two adjacent fins 104.

Figure 1I:
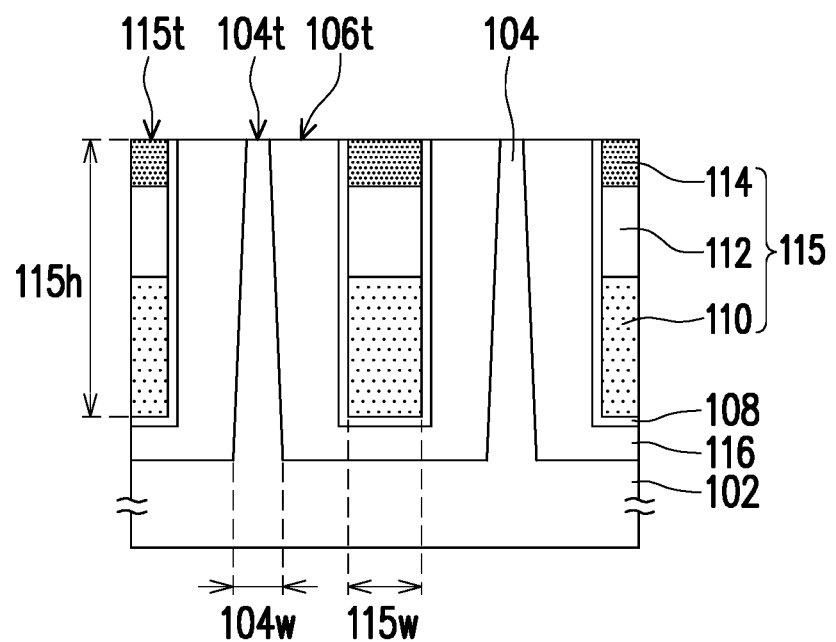

Referring to in FIG. 1H and FIG. 1I, a first planarization process may be performed to remove portions of the third material 114a, the etch stop material 108a, and insulating material 106a, thereby exposing the fins 104. In the case, as shown in FIG. 1I, a plurality of hybrid fins 115 are formed in the trenches 103 and respectively disposed between the fins 104. The hybrid fins 115 are wrapped by the etch stop layer 108. In some embodiments, the hybrid fins 115 are electrically isolating and referred to as isolation fins. In some embodiments, the hybrid fins 115 have a height 115h of about 70 nm to about 90 nm and a width 115w of about 12 nm to about 90 nm, while the fins 104 have a width 104w of about 18 nm to about 23 nm. In some embodiments, a top CD of the fin 104 is 4-8 nm and the effective bottom CD of the fin 104 aligned with a top surface 116t of the isolation region 116 (FIG. 1J) is 8-13 nm. In some embodiments, the top surfaces 104t of the fins 104 are substantially coplanar with top surfaces 115t of the hybrid fins 115 and a top surface 106t of the insulating material 106. In some embodiments, the first planarization process includes a chemical mechanical polish (CMP), an etching back process, a combination thereof, or other suitable process. In addition, although the hybrid fin 115 illustrated in FIG. 1I is a stack fin made of three layers (i.e., the first, second, and third materials 110, 112, and 114), the embodiments of the present disclosure are not limited thereto. In other embodiments, the number of layers of the hybrid fin 115 may be adjusted by the need, such as two layers, four layers, or more layers.

Figure 1J:
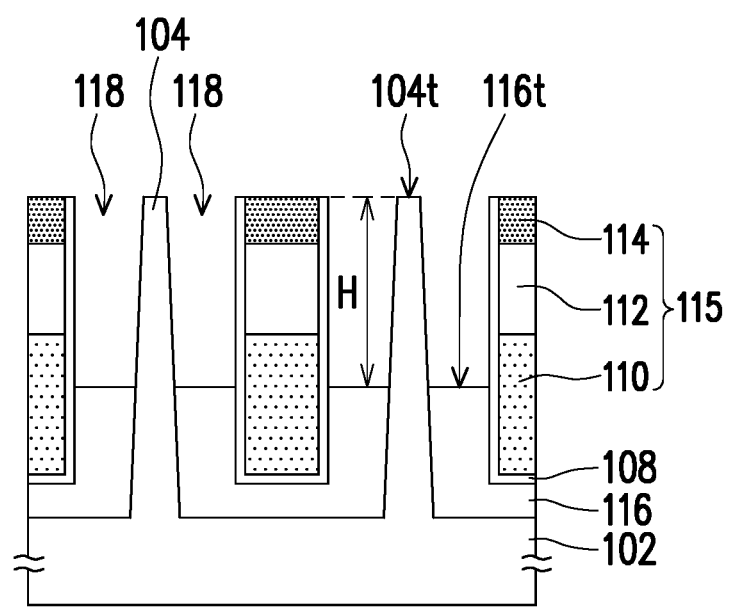

Referring to FIG. 1I and FIG. 1J, the insulating material 106 is recessed to form a plurality of isolation regions 116 between the fins 104. In some embodiments, the insulating material 106 has a higher etching selectivity than the fins 104 and the third material 114 in a step of recessing the insulating material 106. That is, the insulating material 106 has an etching rate greater than the etching rate of the fins 104 and the third material 114 during the recessing the insulating material 106. After recessing the insulating material 106, the fins 104 protrude from between neighboring isolation regions 116 and a plurality of openings 118 are formed on the isolation regions 116. That is, top surfaces 116t of the isolation regions 116 may be lower than the top surfaces 104t of the fins 104. In some embodiments, the insulating material 106 is recessed by using an appropriate etching process, such as a wet etching process with hydrofluoric acid (HF), a dry etching process, or a combination thereof. In some embodiments, a height difference H between the top surfaces 104t of the fins 104 and the top surfaces 116t of the isolation regions 116 ranges from about 45 nm to about 65 nm.

Figure 1K:
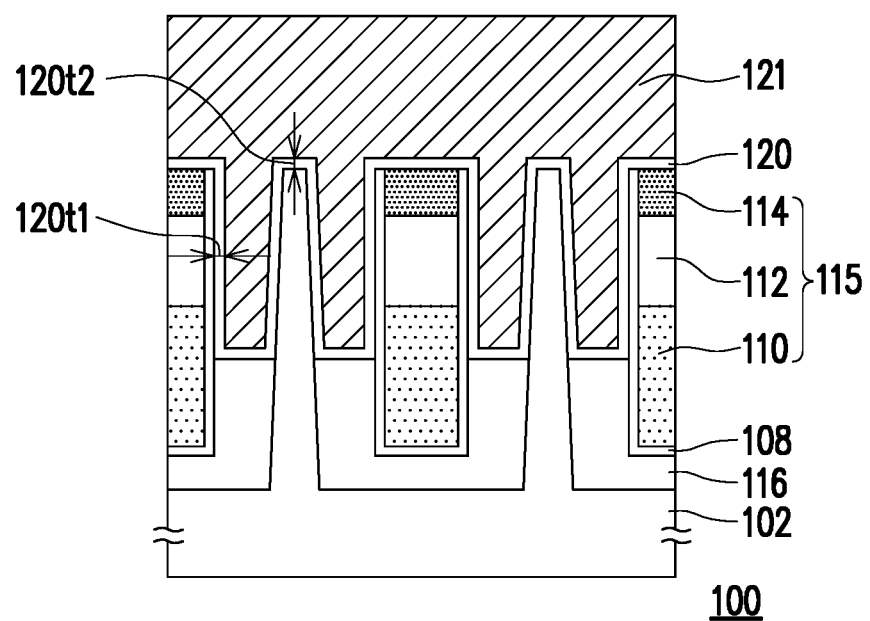

Referring to FIG. 1K, a dielectric material 120 is formed on the hybrid fins 115 and the fins 104. Before forming the dielectric material 120, a Si cap (not shown) may be deposited on the exposed portions of the fins 104 by CVD or furnace to repair dangling bond and improve mobility, especially for SiGe P-type FET. In some embodiments, the Si cap may be a thin epitaxy Si layer and have a thickness of about 5 Å to about 10 Å. In some embodiments, the Si cap and dielectric material 120 conformally covers along the profile of the hybrid fins 115 and the fins 104. The dielectric material 120 may include SiO, SiOC, SiCN, SiC, or a combination thereof, and may be formed by PECVD, ALD, FCVD, thermal oxidation, in-situ steam generation (ISSG), or the like. The Si cap and dielectric material 120 may selectively grown on the hybrid fins 115 and the fins 104. Herein, a combination including the Si cap and dielectric material may be shown as one layer 120 in FIG. 1K and following figures. In some embodiments, the dielectric material 120 has a first thickness 120t1 covering the hybrid fins 115 and a second thickness 120t2 covering the fins 104. The first thickness 120t1 on the hybrid fins 115 is different from the second thickness 120t2 on the fins 104. For example, the said Si cap be used to repair fin surface after etching process, but the epitaxy Si layer is selectively grown on fin surface and dielectric material 115. The thickness and the quality of the Si cap covering the fins 104 and hybrid fins 115 are different, and it would influence the quality and the thickness of dielectric material 120. In the case, the first thickness 120t1 on the hybrid fins 115 may be less than the second thickness 120t2 on the fins 104. On the other hands, an ISSG process is performed to form an oxide layer 120 (i.e., without Si cap) on the hybrid fins 115 and the fins 104, the ISSG process may oxidize or repair surfaces of the hybrid fins 115 and the fins 104 damaged by the foregoing etching process. Since the hybrid fins 115 are made of dielectric material and wrapped by the etch stop layer 108, the first thickness 120t1 on the hybrid fins 115 may be less than the second thickness 120t2 on the fins 104 made of silicon. However, the embodiments of the present disclosure are not limited thereto. In other embodiments, the first thickness 120t1 on the hybrid fins 115 is greater than or equal to the second thickness 120t2 on the fins 104. In some embodiments, the first thickness 120t1 is less than 3 nm, such as about 1 nm to about 3 nm. The second thickness 120t2 may be less than 4 nm, such as about 2 nm to about 4 nm.

As shown in FIG. 1K, a conductive layer 121 is formed on the dielectric material 120, so as to form a structure 100. In some embodiments, the conductive layer 121 fills in the openings 118 (as shown in FIG. 1J) and extends to cover the hybrid fins 115 and the fins 104. The conductive layer 121 may include a silicon-containing material, such as polysilicon, amorphous silicon, or a combination thereof. The conductive layer 121 may be formed by using a suitable process, such as high-density plasma chemical vapor deposition (HDPCVD), ALD, CVD, PVD, plating, or combinations thereof. Although the conductive layer 121 illustrated in FIG. 1K is a single-layered structure, the embodiments of the present disclosure are not limited thereto. In other embodiments, the conductive layer 121 may be a multi-layered structure.

FIGS. 2, 4, 6, 8, and 10 are schematic top views illustrating various stages of a sequential manufacturing process for forming a semiconductor device. FIGS. 3A, 5A, 7A, 9A, and 11A are schematic cross-sectional views taken along the line A-A' of FIGS. 2, 4, 6, 8, and 10. FIGS. 3B, 5B, 7B, 9B, and 11B are schematic cross-sectional views taken along the line B-B' of FIGS. 2, 4, 6, 8, and 10. FIGS. 3C, 5C, 7C, 9C, and 11C are schematic cross-sectional views taken along the line C-C' of FIGS. 2, 4, 6, 8, and 10.

Figure 2:
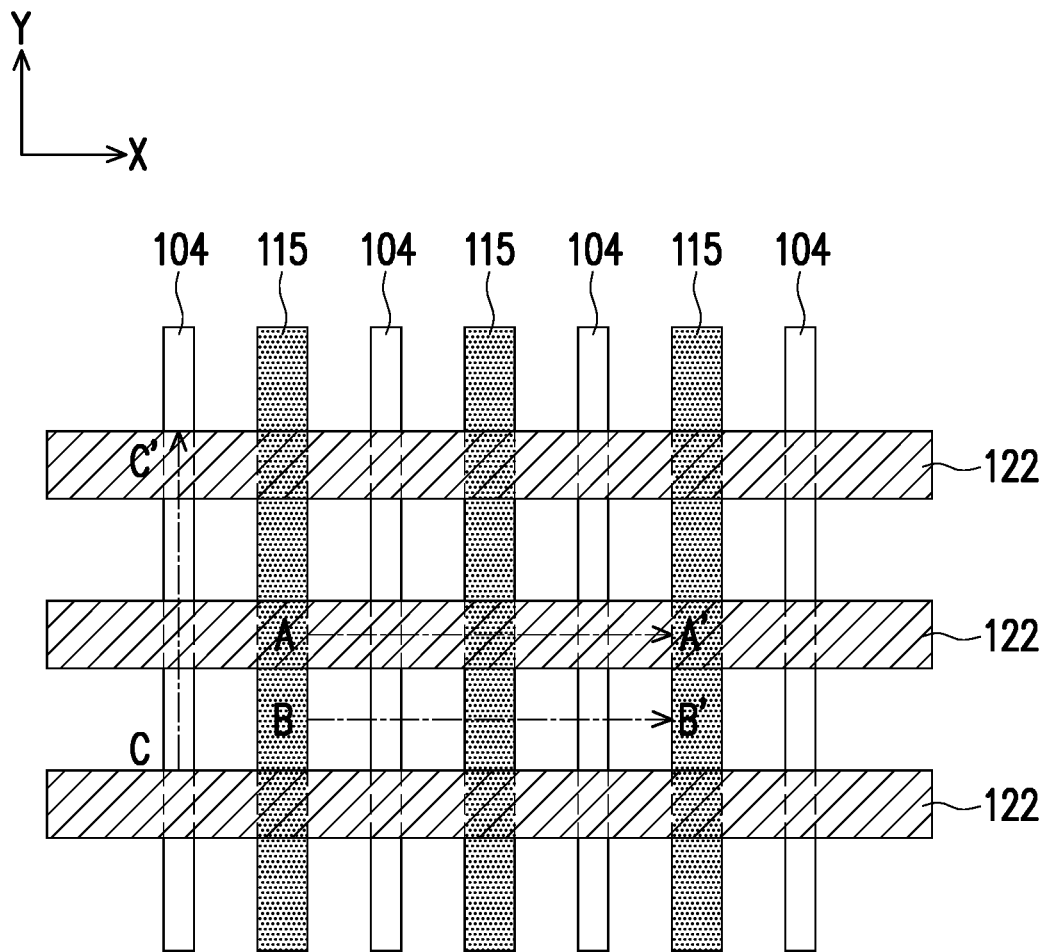
FIGS. 2, 4, 6, 8, and 10 are schematic top views illustrating various stages of a sequential manufacturing process for forming a semiconductor device in accordance with some embodiments of the disclosure.
Figure 3A:
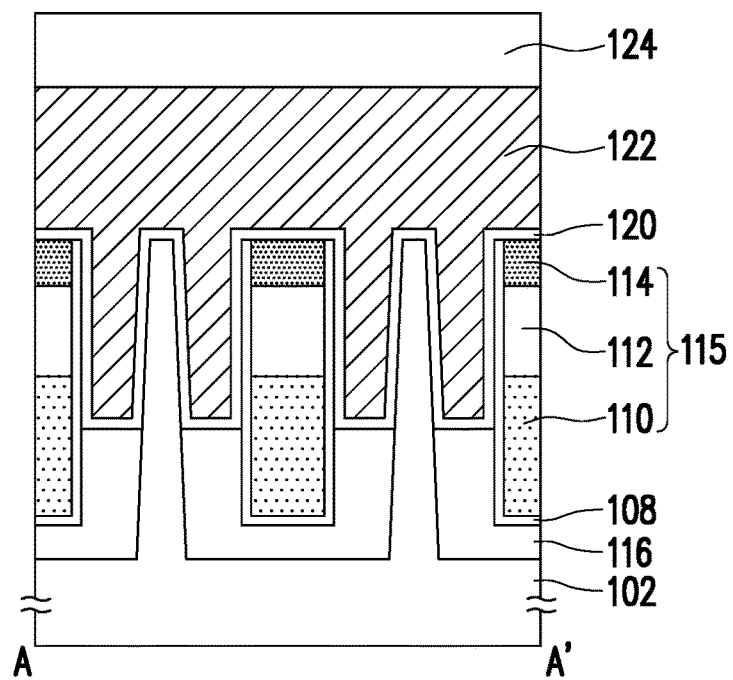
FIGS. 3A, 5A, 7A, 9A, and 11A are schematic cross-sectional views taken along the line A-A' of FIGS. 2, 4, 6, 8, and 10 in accordance with some embodiments of the disclosure.
Figure 3B:
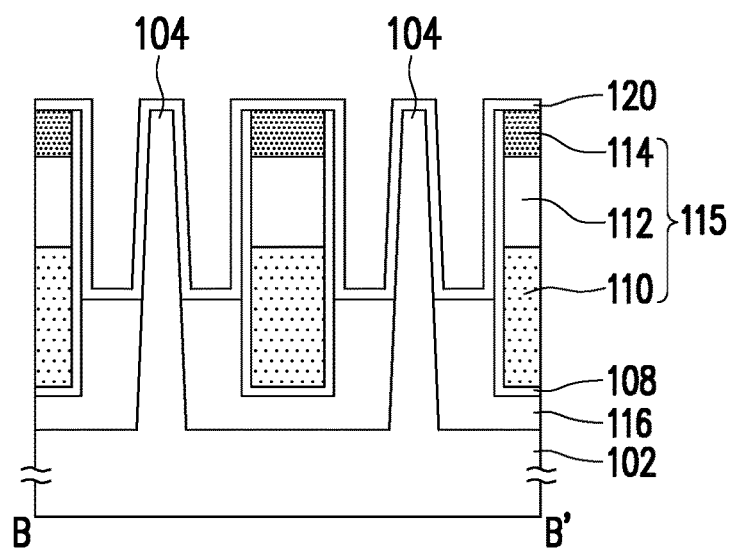
FIGS. 3B, 5B, 7B, 9B, and 11B are schematic cross-sectional views taken along the line B-B' of FIGS. 2, 4, 6, 8, and 10 in accordance with some embodiments of the disclosure.
Figure 3C:
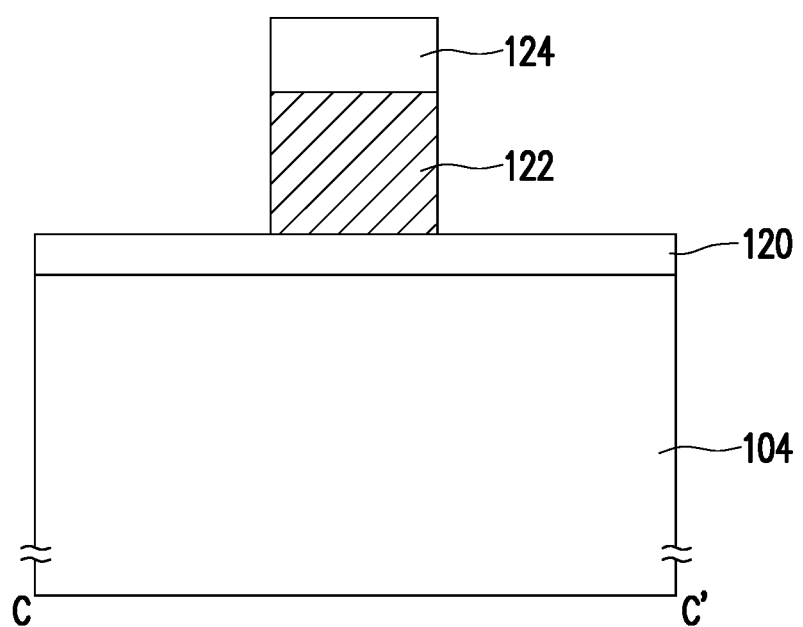
FIGS. 3C, 5C, 7C, 9C, and 11C are schematic cross-sectional views taken along the line C-C' of FIGS. 2, 4, 6, 8, and 10 in accordance with some embodiments of the disclosure.
Figure 4:
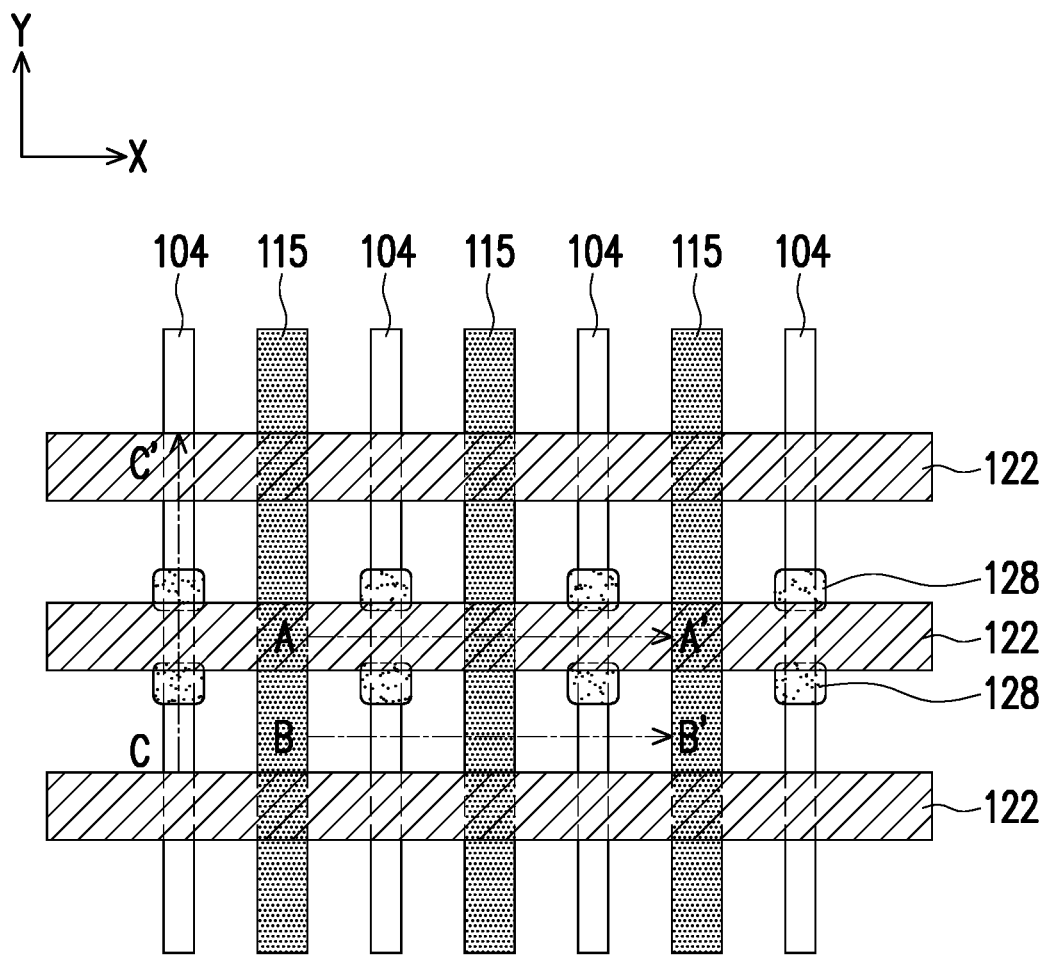

Referring to FIG. 2 and FIG. 3A to FIG. 3C, the structure 100 of FIG. 1K is provided and the conductive layer 121 is patterned to form a plurality of gates 122. For the sake of clarity, only the fins 104, the hybrid fins 115, and the gates 122 are illustrated in FIG. 2. Specifically, a mask pattern 124 is formed on the conductive layer 121, a portion of the conductive layer 121 is removed by using the mask pattern 124 as an etching mask. In some embodiments, the mask pattern 124 includes SiO, SiN, SiON, SiC, or a combination thereof, and may be formed by HDPCVD, PECVD, ALD, FCVD, or the like. In the case, as shown in FIG. 2, the gates 122 are strips (hereinafter called gate strips) extending along an X direction, and the fins 104 and the hybrid fins 115 extend along an Y direction. The fins 104 and the hybrid fins 115 are arranged alternately in the X direction. The gate strips 122 are across and cover portions of the fins 104 and the hybrid fins 115. As shown in FIG. 3B and FIG. 3C, the conductive layer 121 is etched and stopped on the dielectric material 120. Herein, the gate strips 122 are referred to as dummy gates that may be replaced by metal gate in the following gate replacement process.

Figure 5A:
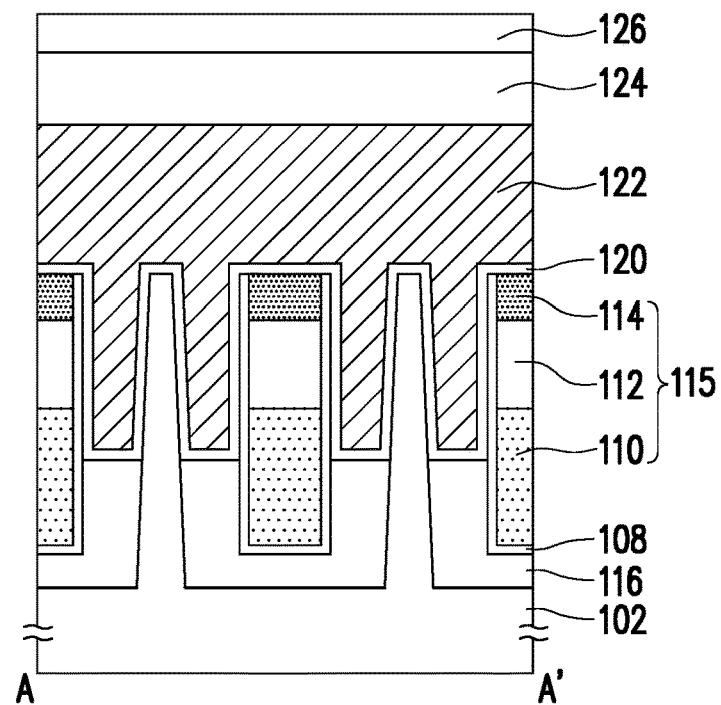
Figure 5B:
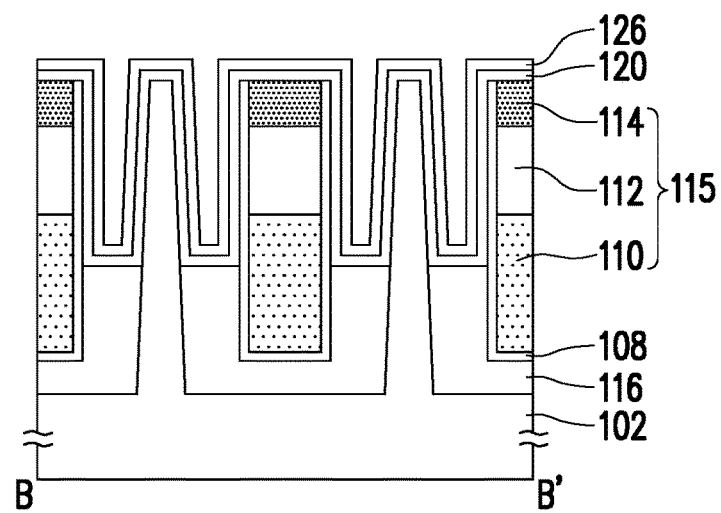
Figure 5C:
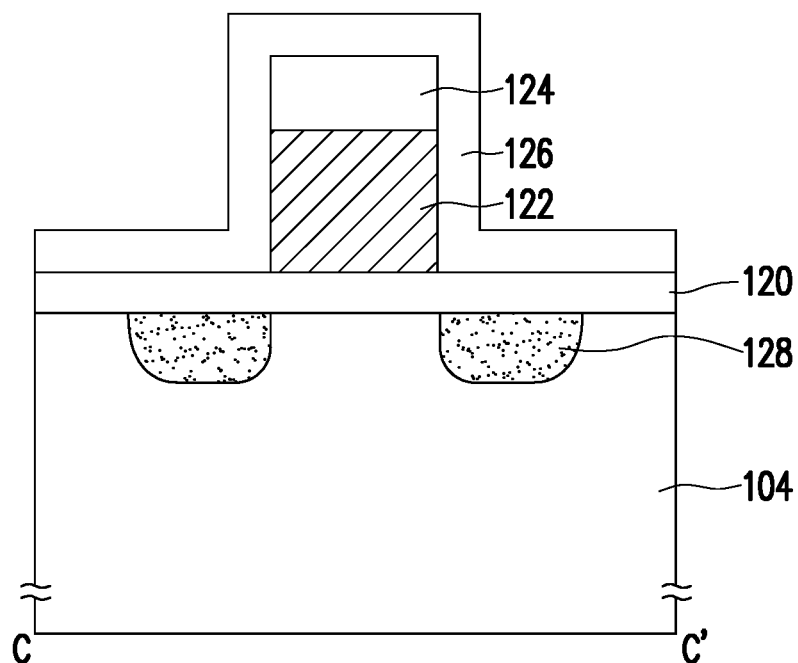
Figure 6:
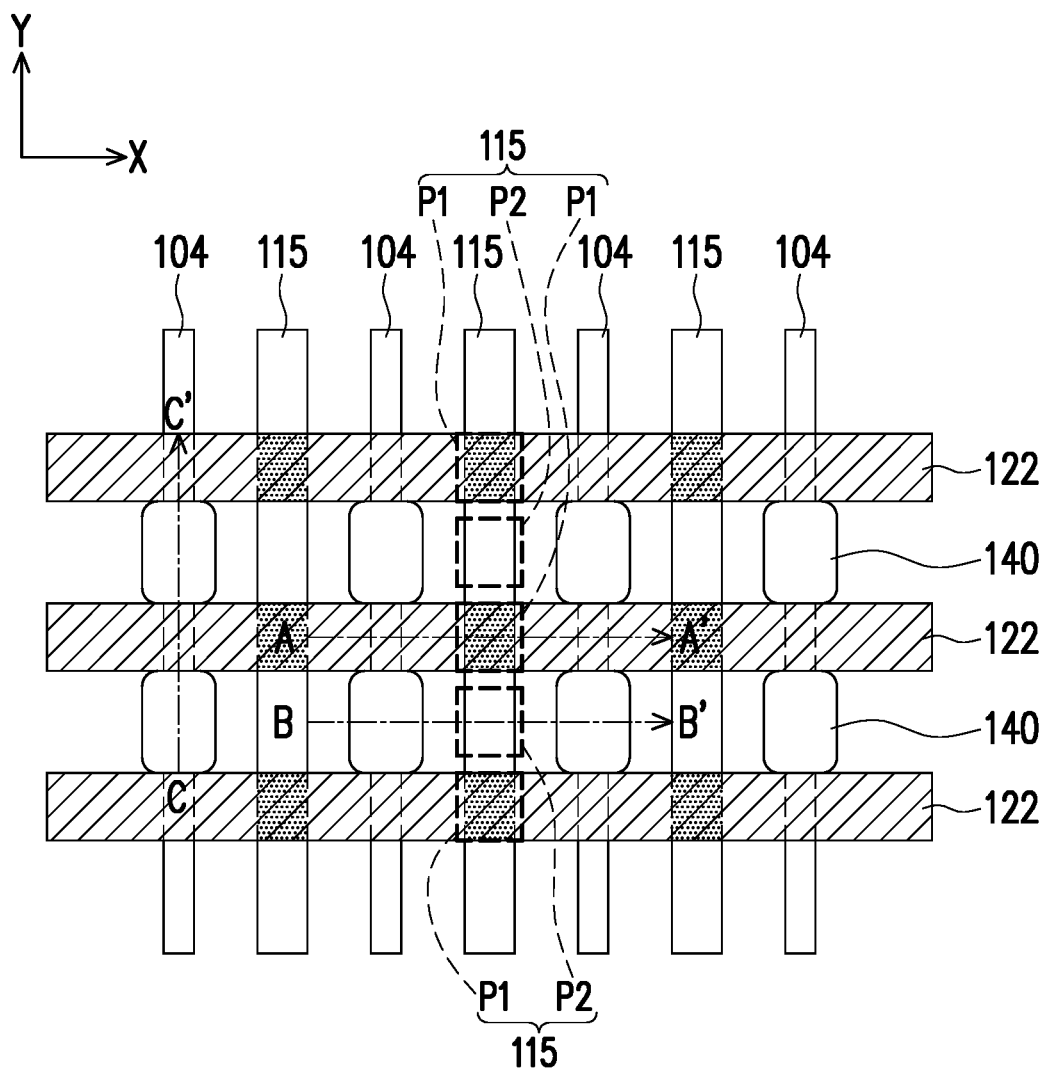

Referring to FIG. 4 and FIG. 5A to FIG. 5C, a spacer material 126 is formed on the dielectric material 120, the gate strips 122, and the mask pattern 124. In some embodiments, the spacer material 126 conformally covers along the profile of the fins 104 and the hybrid fins 115, as shown in FIG. 5B. In some embodiments, the spacer material 126 includes a dielectric material, such as SiO, SiN, SiON, SiCON, or a combination thereof. Although the spacer material 126 illustrated in FIG. 5C is a single-layered structure, the embodiments of the present disclosure are not limited thereto. In other embodiments, the spacer material 126 may be a multi-layered structure.

After forming the spacer material 126, lightly doped source/drain (LDD) regions 128 are formed in the fins 104. In some embodiments, a photoresist (not shown) is formed and appropriate type (e.g., n-type or p-type) impurities may be implanted into portions of the fins 104 by using the photoresist as a mask. The photoresist is then removed. In some embodiments, the n-type impurities may be may be phosphorus, arsenic, or the like implanted in the regions to a concentration of about $10^{14}$ cm$^{-3}$ to about $10^{16}$ cm$^{-3}$, and the p-type impurities may be boron, BF2, or the like implanted in the regions to a concentration of about $10^{14}$ cm$^{-3}$ to about $10^{16}$ cm$^{-3}$. An anneal step may be used to activate the implanted impurities.

Referring to FIG. 6 and FIG. 7A to FIG. 7C, a first etching process is performed to remove portions of the spacer material 126, the dielectric material 120, the third material 114, and the fins 104, so as to form a plurality of recessed portions R. In some embodiments, the first etching process includes an anisotropic etching process, an isotropic etching process, or a combination thereof. The first etching process may include a plurality of etching steps to remove the spacer material 126, the dielectric material 120, the third material 114, and the fins 104 in order. After performing the first etching process, a strained material 140 (or a highly doped low resistance material) is grown on the recessed portions R and extends beyond the top surfaces 116t of the isolation regions 116 to strain or stress the fins 104.

In some embodiments, the strained material 140 includes any acceptable material, such as appropriate for p-type FinFETs. For example, if the fins 104 are silicon, the strained material 140 may include SiGe, SiGeB, Ge, GeSn, or the like. In some alternative embodiments, the strained material 140 includes any acceptable material, such as appropriate for n-type FinFETs. For example, if the fins 104 are silicon, the strained material 140 may include silicon, SiC, SiCP, SiP, or the like.

In some embodiments, the strained material 140 may be doped with a conductive dopant. For example, the strained material 140, such as SiGe, may be epitaxial-grown with a p-type dopant for straining a p-type FinFET. That is, the strained material 140 is doped with the p-type dopant to be the source and the drain of the p-type FinFET. The p-type dopant includes boron or BF$_2$, and the strained material 140 may be epitaxial-grown by LPCVD process with in-situ doping. In some alternative embodiments, the strained material 140, such as SiC, SiP, a combination of SiC/SiP, or SiCP is epitaxial-grown with an n-type dopant for straining an n-type FinFET. That is, the strained material 140 is doped with the n-type dopant to be the source and the drain of the n-type FinFET. The n-type dopant includes arsenic and/or phosphorus, and the strained material 140 may be epitaxial-grown by LPCVD process with in-situ doping.

Figure 7A:
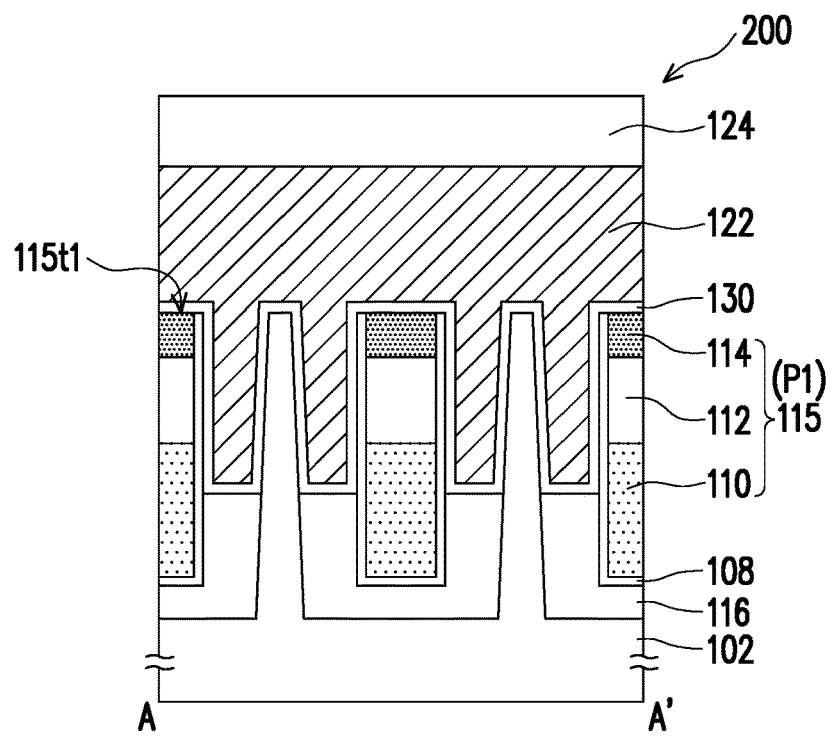
Figure 7B:
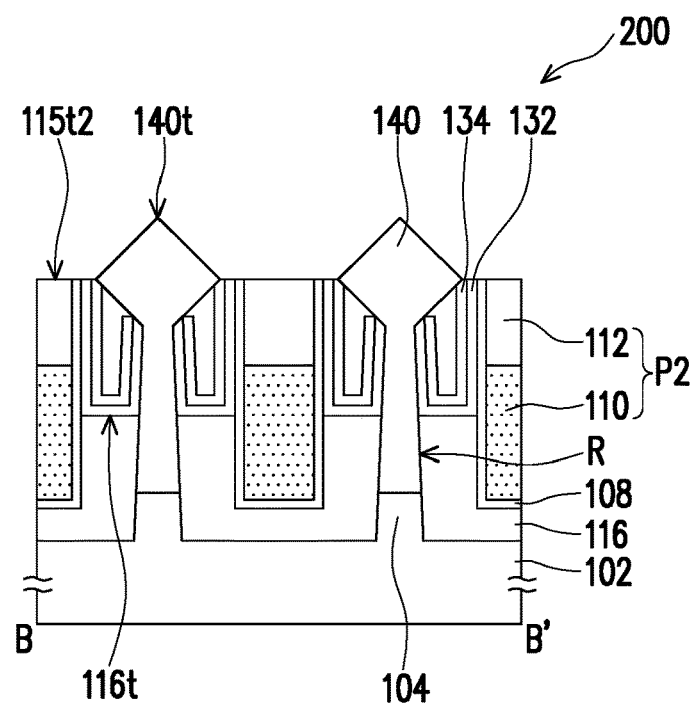
Figure 7C:
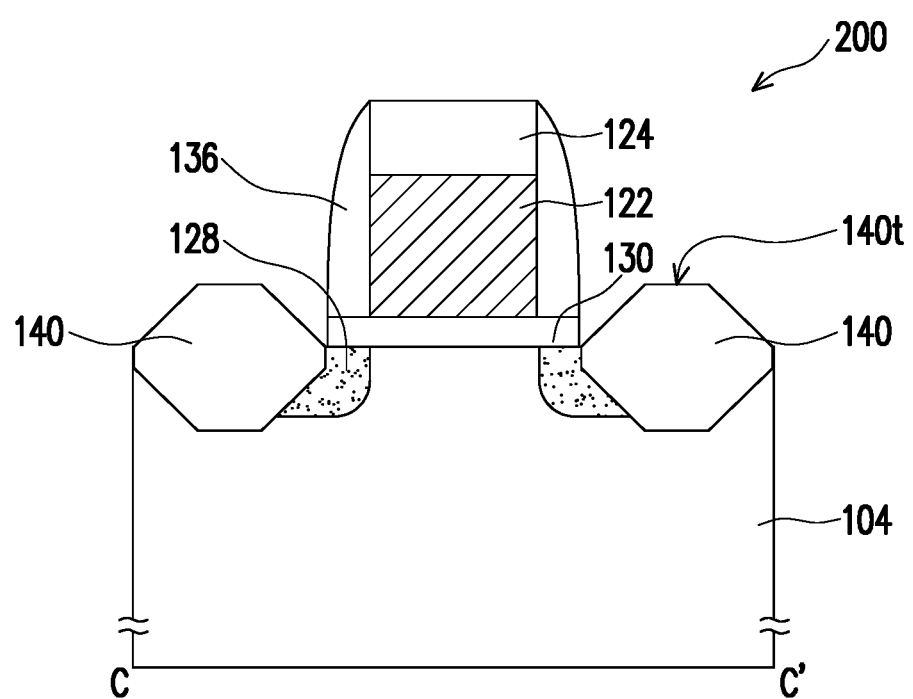

As a result of the epitaxial-grown process used to form the strained material 140, the cross section of the strained material 140 along the line C-C' may have a diamond or pentagonal shape as illustrated in FIG. 7C. However, the embodiments of the present disclosure are not limited thereto. In other embodiments, the cross section of the strained material 140 also have a hexagonal shape, a pillar shape, or a bar shape.

In the present embodiment, the strained material 140 includes a source disposed at one side of the gate strip 122 and a drain disposed at another side of the gate strip 122. Hereinafter, the strained material 140 may be referred to as source/drain (S/D) regions 140.

After foregoing processes, as shown in FIG. 7C, a portion of the etched spacer material 126 is formed as a pair of spacers 136 on sidewalls of the gate strip 122 and the mask pattern 124. A portion of the etched dielectric material 120 is formed as a dielectric layer 130 between the gate strip 122 and the fin 104 and between the spacers 126 and the fin 104. As shown in FIG. 7A, the dielectric layer 130 further extends along the profile of the fins 104 and the hybrid fins 115. As shown in FIG. 7B, another portion of the etched dielectric material 120 is formed as a dielectric layer 132 disposed on the isolation regions 116 and covering sidewalls of the hybrid fins 115 and lower portions of sidewalls of the S/D regions 140. In addition, another portion of the etched spacer material 126 is formed as a spacer layer 134 on the dielectric layer 132.

It should be noted that the hybrid fin 115 may include a plurality of first portions P1 and a plurality of second portions P2 arranged alternately along the Y direction. As shown in FIG. 7A, the first portion P1 may include the first material 110, the second material 112, and the third material 114. The first material 110 is partially embedded in the isolation region 116. The second material 112 is disposed between the first material 110 and the third material 114. The gate strip 122 covers and across the first portions P1. As shown in FIG. 7B, the second portions P2 may include the first material 110 and the second material 112. The second portions P2 are disposed between the S/D regions 140. Top surfaces 115t2 of the second portions P2 is lower than top surfaces 115t1 of the first portions P1. In some embodiments, as shown in FIG. 7B, two adjacent S/D regions 140 are separated or electrically isolated from each other by the second portion P2. Although the S/D regions 140 illustrated in FIG. 7B are separated from the second portions P2 by the dielectric layer 132, the spacer layer 134, and the etch stop layer 108, the embodiments of the present disclosure are not limited thereto. In other embodiments, upper sidewalls of the second material 112 are exposed by the dielectric layer 132, the spacer layer 134, and the etch stop layer 108, so that the S/D regions 140 may be in contact with the second material 112 of the adjacent hybrid fin 115. The etch stop layer 108 at least wraps the sidewalls of the first material 110 to prevent the first material 110 from being removed in the first etching process and forming a seam and/or a void in the hybrid fin 115. In some embodiments, the second material 112 with the high-k dielectric material may be hard enough to prevent two adjacent S/D regions 140 from merging. In the case, the S/D region 140 is limited within a space between two adjacent hybrid fins 115. In some embodiments, as shown in FIG. 7B, top surfaces 140t of the S/D regions 140 are greater than the top surfaces 115t2 of the second portions P2.

Figure 8:
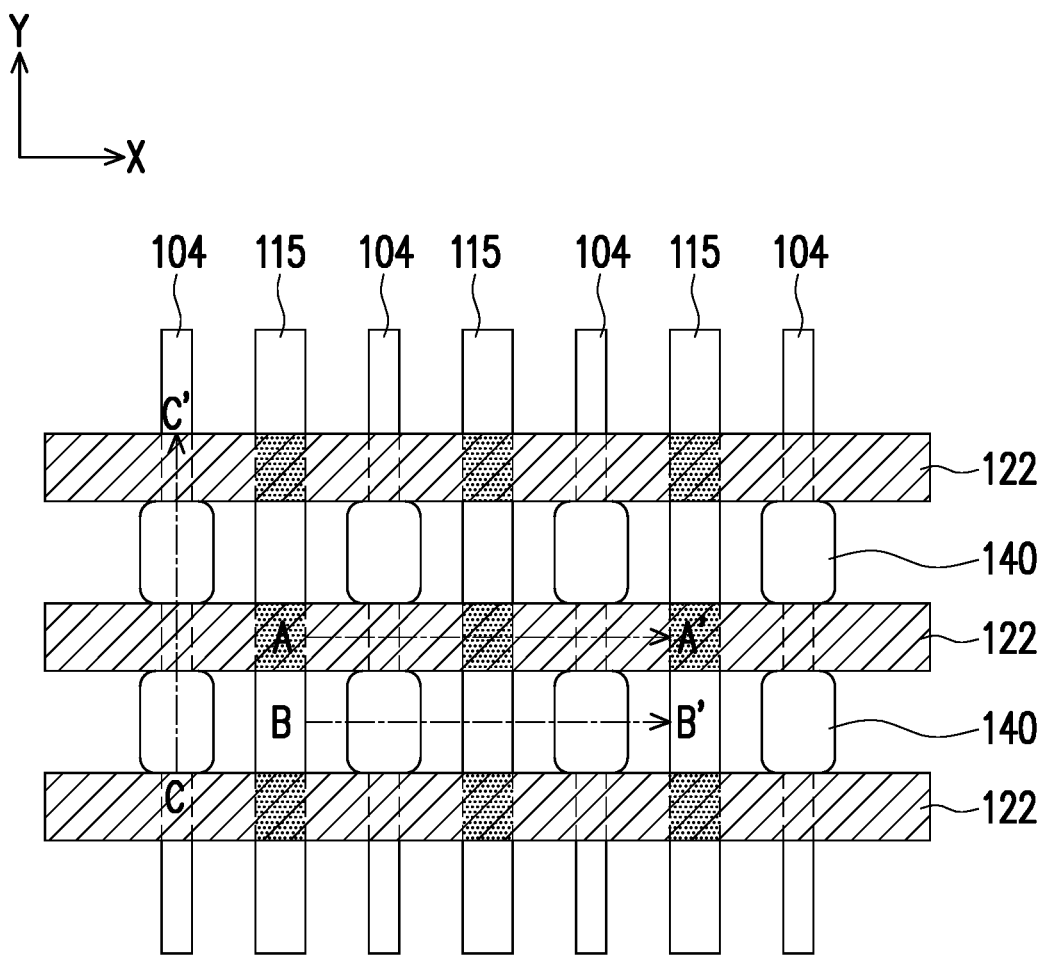
Figure 9A:
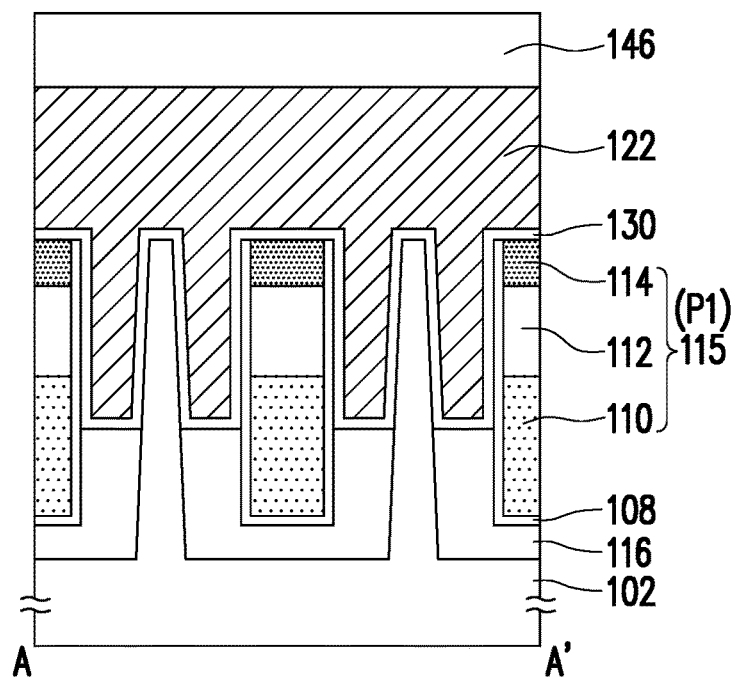
Figure 9B:
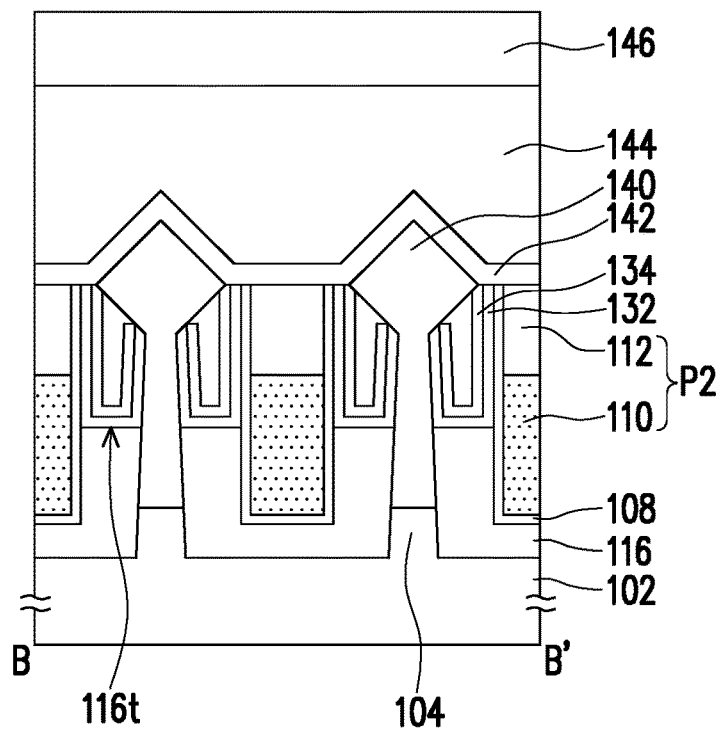
Figure 9C:
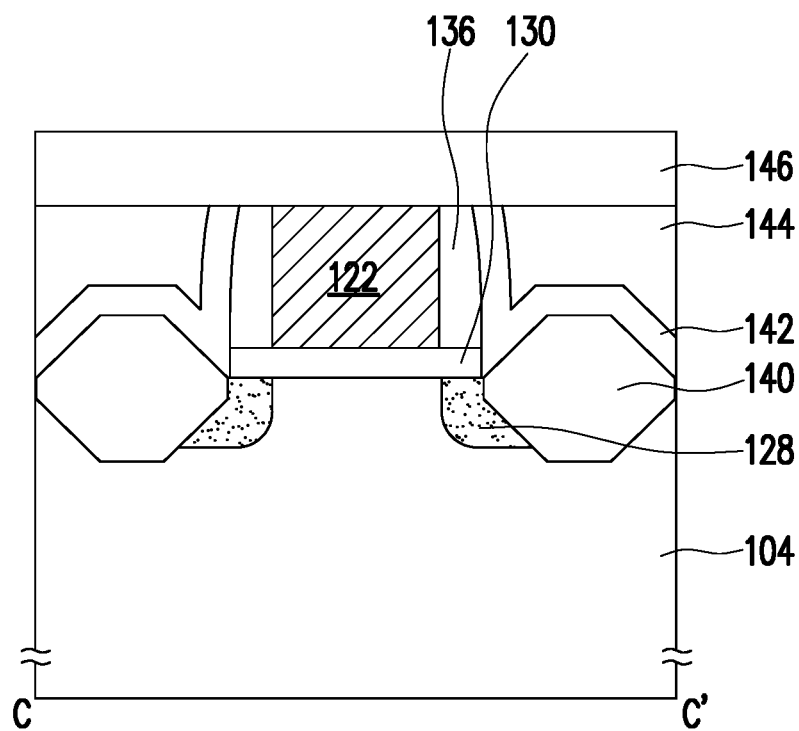

Referring to FIG. 8 and FIG. 9A to FIG. 9C, a contact etch stop layer (CESL) 142 and an interlayer dielectric (ILD) layer 144 are sequentially formed on a structure 200 illustrated in FIGS. 7A-7C. For the sake of clarity, only the fins 104, the hybrid fins 115, the gates 122, and the S/D regions 140 are illustrated in FIG. 8. In some embodiments, the CESL 142 include SiO, SiOC, SiCN, SiC, SiN or a combination thereof, and may be formed by PECVD, ALD, FCVD, or the like. In some embodiments, the ILD layer 144 includes silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), polyimide, and/or a combination thereof. In some other embodiments, the ILD layer 144 includes low-k dielectric materials. Examples of low-k dielectric materials include BLACK DIAMOND® (Applied Materials of Santa Clara, Calif.), Xerogel, Aerogel, amorphous fluorinated carbon, Parylene, BCB (bis-benzocyclobutenes), Flare, SILK® (Dow Chemical, Midland, Mich.), hydrogen silsesquioxane (HSQ) or fluorinated silicon oxide (SiOF), and/or a combination thereof. In alternative embodiments, the ILD layer 144 include one or more dielectric materials and/or one or more dielectric layers. In some embodiments, the ILD layer 144 is formed to a suitable thickness by FCVD, PECVD, HDPCVD, SACVD, spin-on, sputtering, or other suitable methods. For example, an interlayer dielectric material (not shown) is initially formed to cover the CESL 142 and the gate strips 122. Subsequently, a thickness of the interlayer dielectric material layer is reduced until the gate strips 122 are exposed, so as to form the ILD layer 144. The process of reducing the thickness of the interlayer dielectric material layer may be achieved by a CMP process, an etching back process, or other suitable processes.

After forming the ILD layer 144, a mask layer 146 is formed on the ILD layer 144. In some embodiments, the mask layer 146 may be a hard mask made of SiO, SiN, SiON, SiC, or a combination thereof, and may be formed by HDPCVD, PECVD, ALD, FCVD, or the like.

Figure 10:
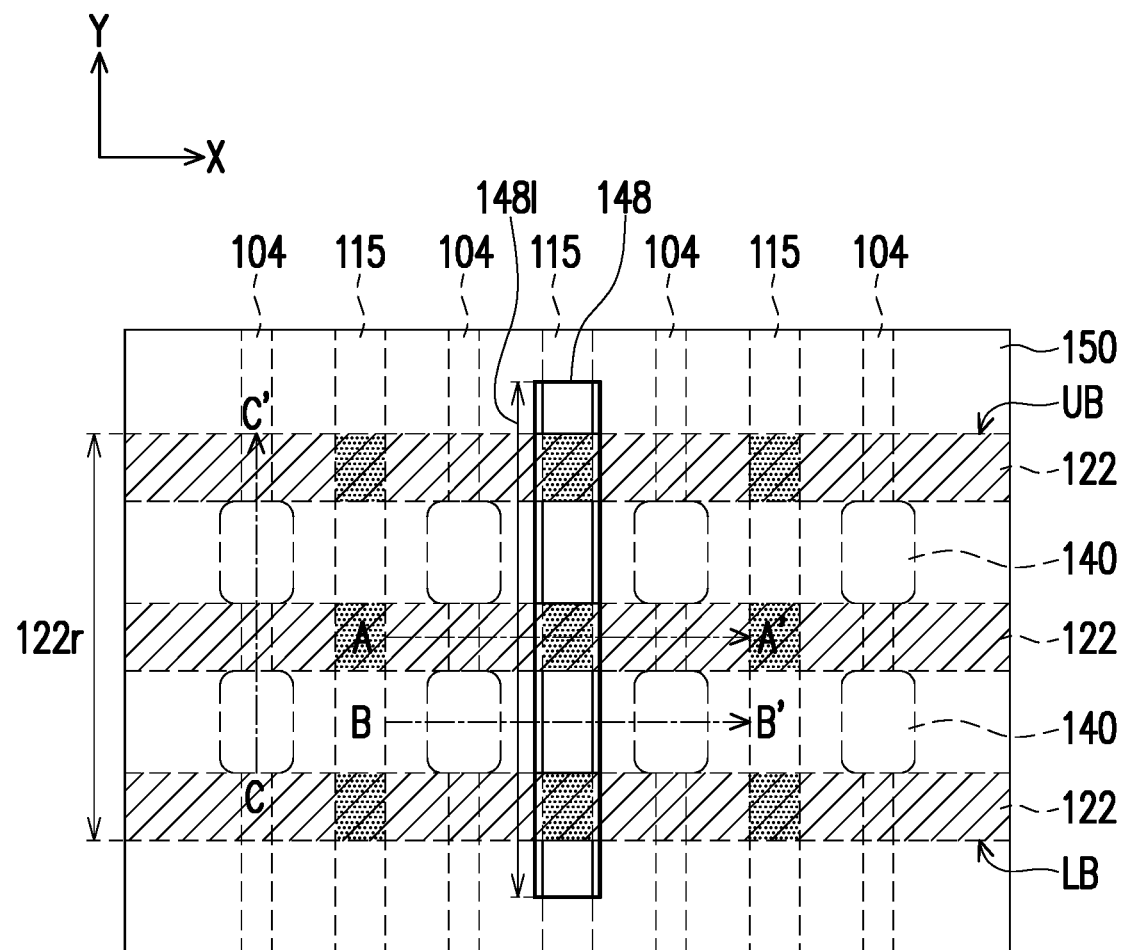
Figure 11A:
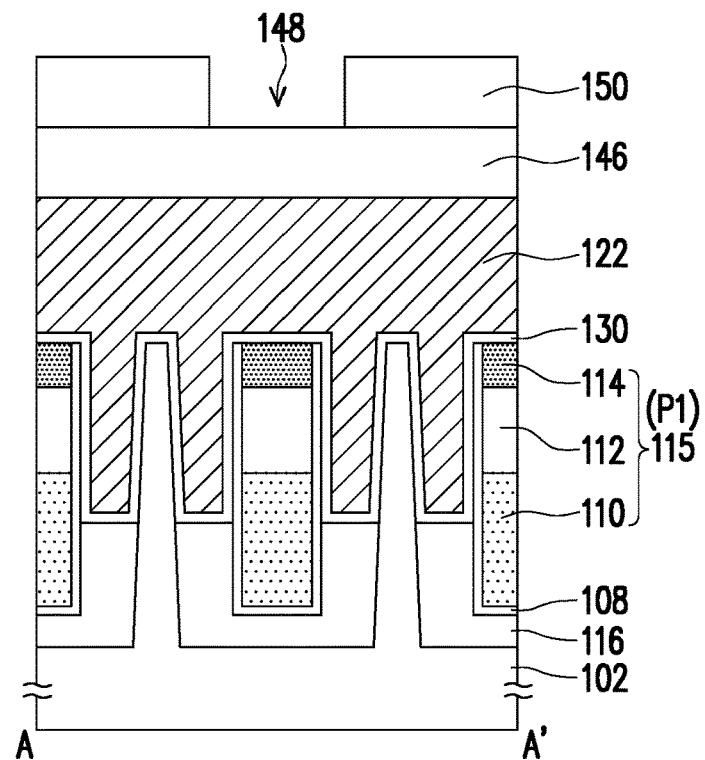
Figure 11B:
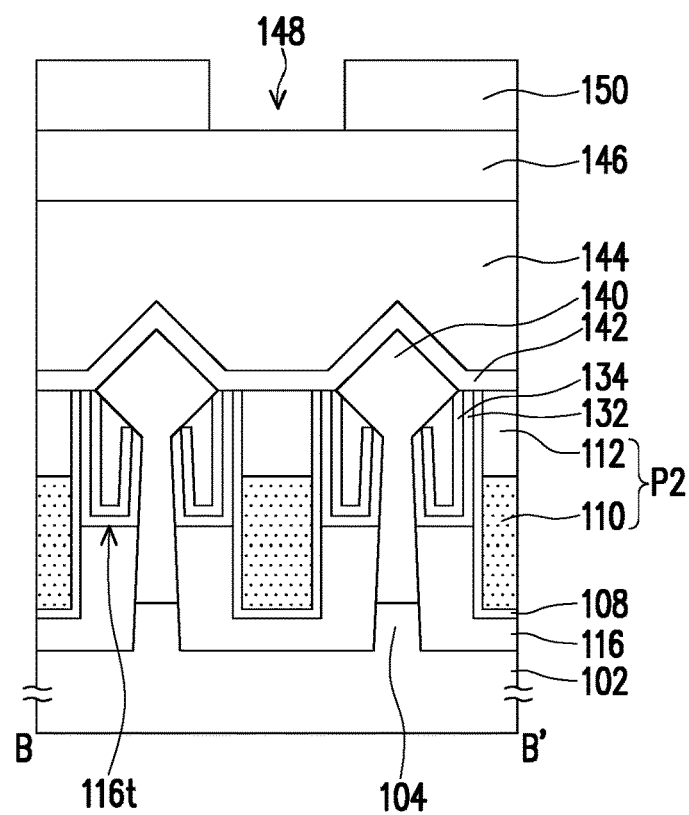
Figure 11C:
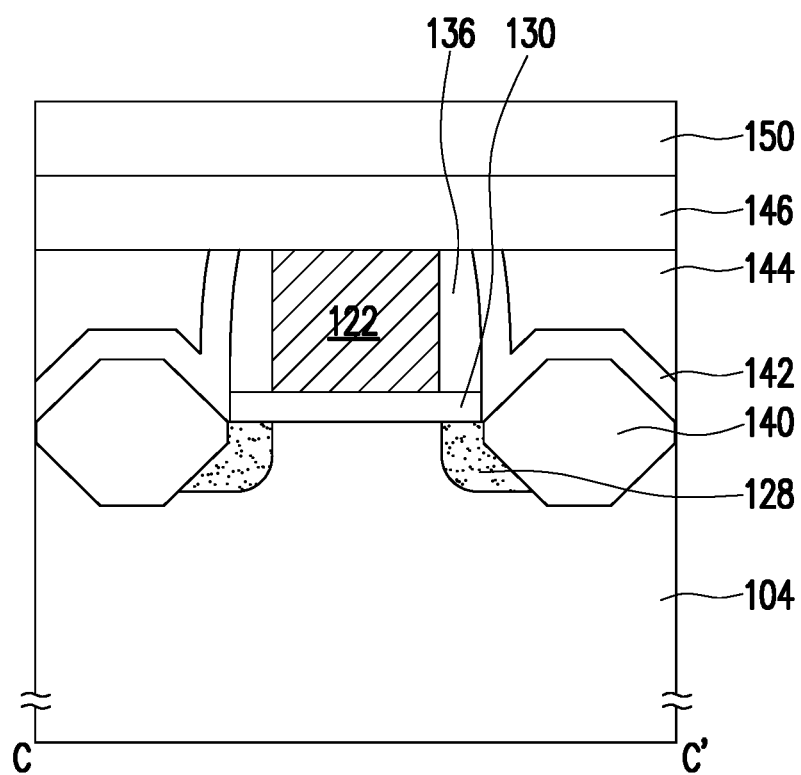

Referring to FIG. 10 and FIG. 11A to FIG. 11C, a photoresist 150 is formed on the mask layer 146. In some embodiments, the photoresist 150 has an opening 148 exposing the mask layer 146. As shown in FIG. 10, the opening 148 is a rectangular shape across the gate strips 122. In some embodiments, the opening 148 has a length 148*l* beyond a range 122*r* of the gate strips 122. That is, the opening 148 may spill over an upper boundary UB and a lower boundary LB of the gate strips 122 to make sure the gate strips 122 are covered by the opening 148.

FIGS. 12A, 13A, 14A, and 15A are schematic cross-sectional views illustrating a method for forming a semiconductor device taken along the line A-A' of FIG. 10. FIGS. 12B, 13B, 14B, and 15B are schematic cross-sectional views illustrating a method for forming a semiconductor device taken along the line B-B' of FIG. 10.

Figure 12A:
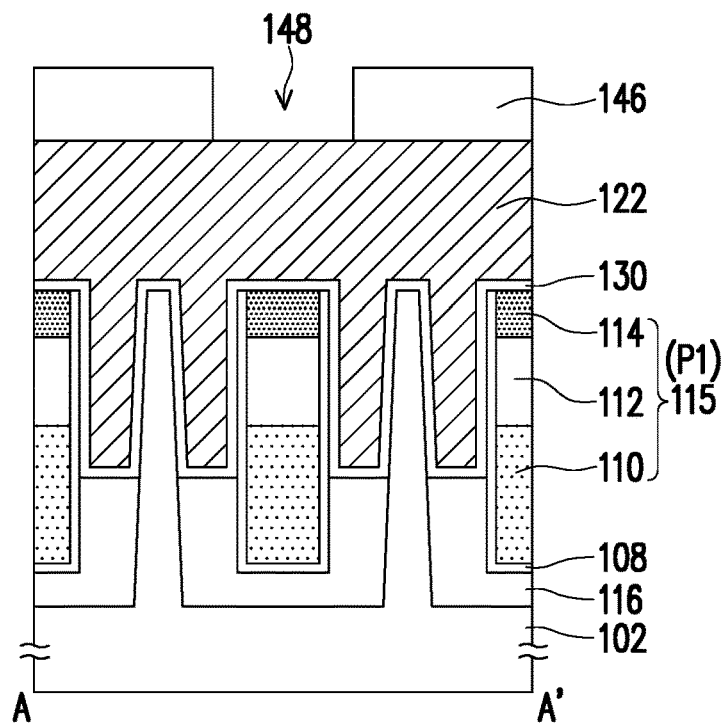
FIGS. 12A, 13A, 14A, and 15A are schematic cross-sectional views illustrating a method for forming a semiconductor device taken along the line A-A' of FIG. 10 in accordance with some embodiments of the disclosure.
Figure 12B:
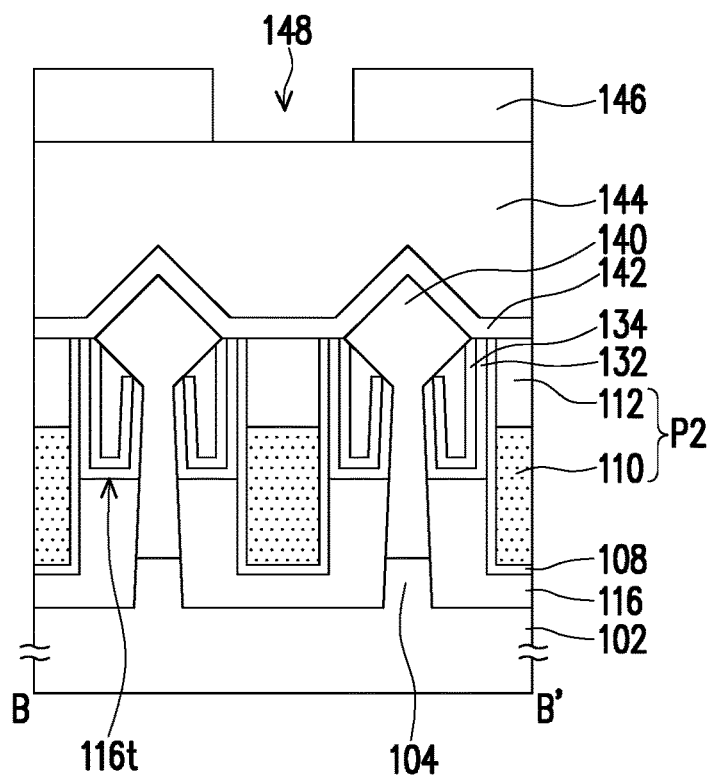
FIGS. 12B, 13B, 14B, and 15B are schematic cross-sectional views illustrating a method for forming a semiconductor device taken along the line B-B' of FIG. 10 in accordance with some embodiments of the disclosure.

Referring to FIG. 12A to FIG. 12B, the mask layer 146 is patterned by using the photoresist 150 as a mask. In the case, the opening 148 is extended into the mask layer 146, so that the gate strip 122 and the ILD layer 144 are exposed by the opening 148. After patterning the mask layer 146, the photoresist 150 is removed, as shown in FIG. 12A and FIG. 12B.

Figure 13A:
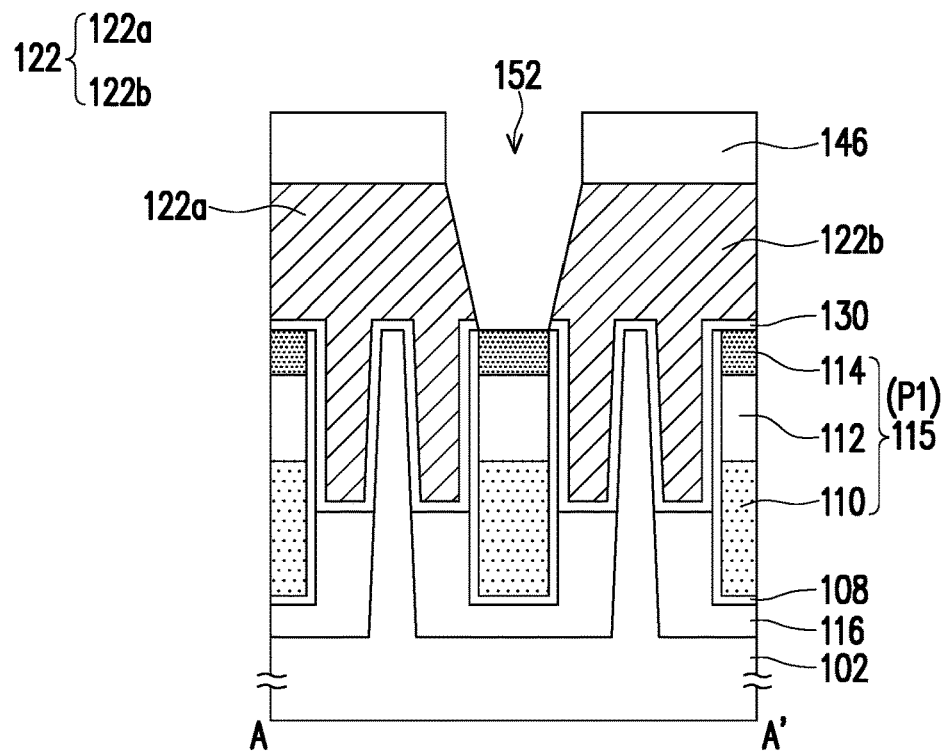
Figure 13B:
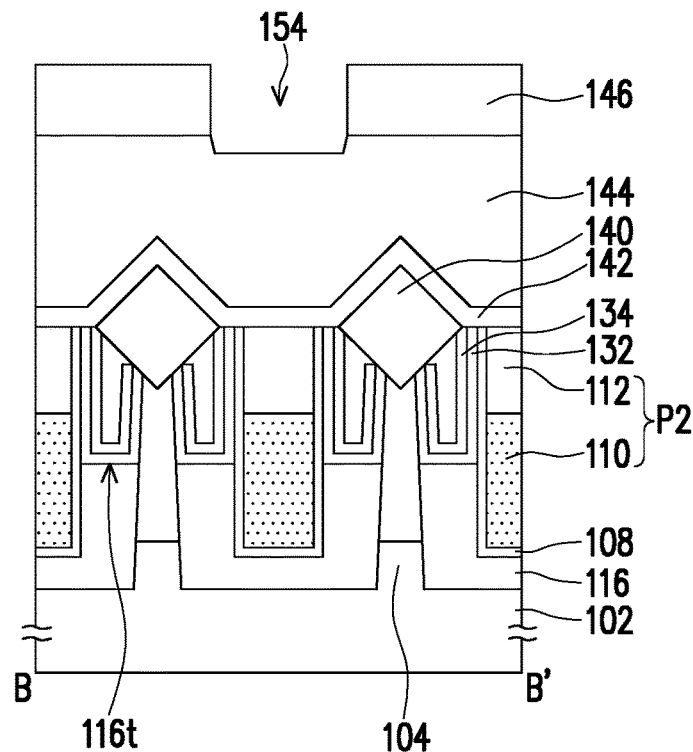

Referring to FIG. 13A to FIG. 13B, a second etching process is performed by using the mask layer 146 as a mask, so as to remove a portion of the gate strips 122. In some embodiments, the second etching process includes an anisotropic etching process, an isotropic etching process, or a combination thereof. The second etching process may include a plurality of etching steps to remove the gate strip 122 and the dielectric layer 130 in order. In the case, as shown in FIG. 13A, the opening 148 is extended into the gate strip 122 and the dielectric layer 130 to form an opening 152. The opening 152 may expose the third material 114 of the hybrid fin 115. After forming the opening 152, the gate strip 122 is divided into two segments 122*a* and 122*b*, as shown in FIG. 13A. In some embodiments, the third material 114 is referred to as an etching stop layer in the second etching process, so as to make sure the segments 122*a* and 122*b* separated from each other. On the other hand, the gate strip 122 and the ILD layer 144 have different etching selectivities in the second etching process. That is, the gate strip 122 has an etching rate greater than an etching rate of the ILD layer 144 during the second etching process. Accordingly, a few of the ILD layer 144 is removed while most of the gate strip 122 are removed. In the case, as shown in FIG. 13A and FIG. 13B, the opening 152 in the gate strip 122 is deeper than an opening 154 in the ILD layer 144.

Figure 14A:
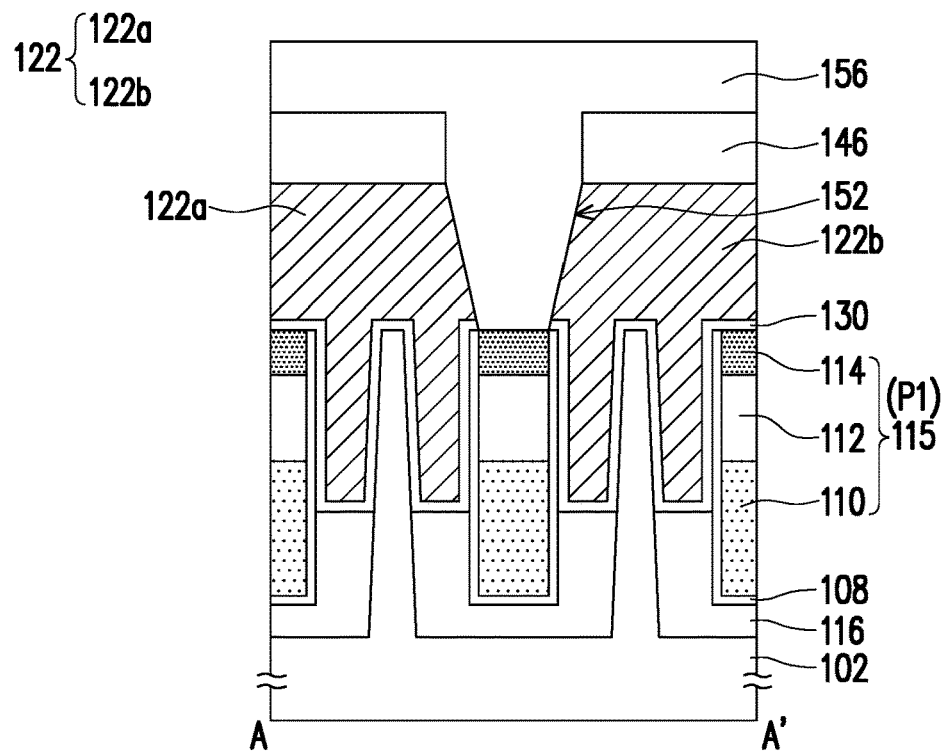
Figure 14B:
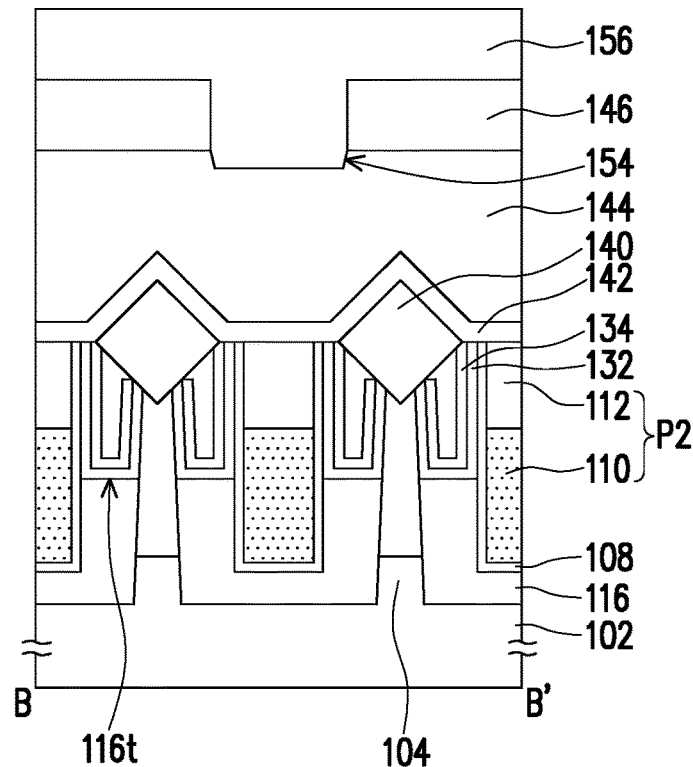

Referring to FIG. 14A to FIG. 14B, a dielectric material 156 is formed and filled in the openings 152 and 154. In some embodiments, the dielectric material 156 include SiN, SiO, SiOCN, the like, or a combination thereof, and may be formed by HDPCVD, PECVD, ALD, FCVD, or the like. In some alternative embodiments, the dielectric material 156 has a dielectric constant greater than the dielectric constant the ILD layer 144. Although the dielectric material 156 illustrated in FIG. 14A is a single-layered structure, the embodiments of the present disclosure are not limited thereto. In other embodiments, the dielectric material 156 may be a multi-layered structure. For example, the dielectric material 156 has a lower layer and an upper layer. The lower layer may conformally cover the openings 152 and 154. The upper layer is formed on the lower layer and filled up the openings 152 and 154. The lower layer and the upper layer may have different materials, such as SiO/SiN, SiOCN/SiN, or selective-Si/SiN. In other embodiments, the number of layers of the dielectric material 156 may be adjusted by the need, such as three layers, four layers, or more layers.

Figure 15A:
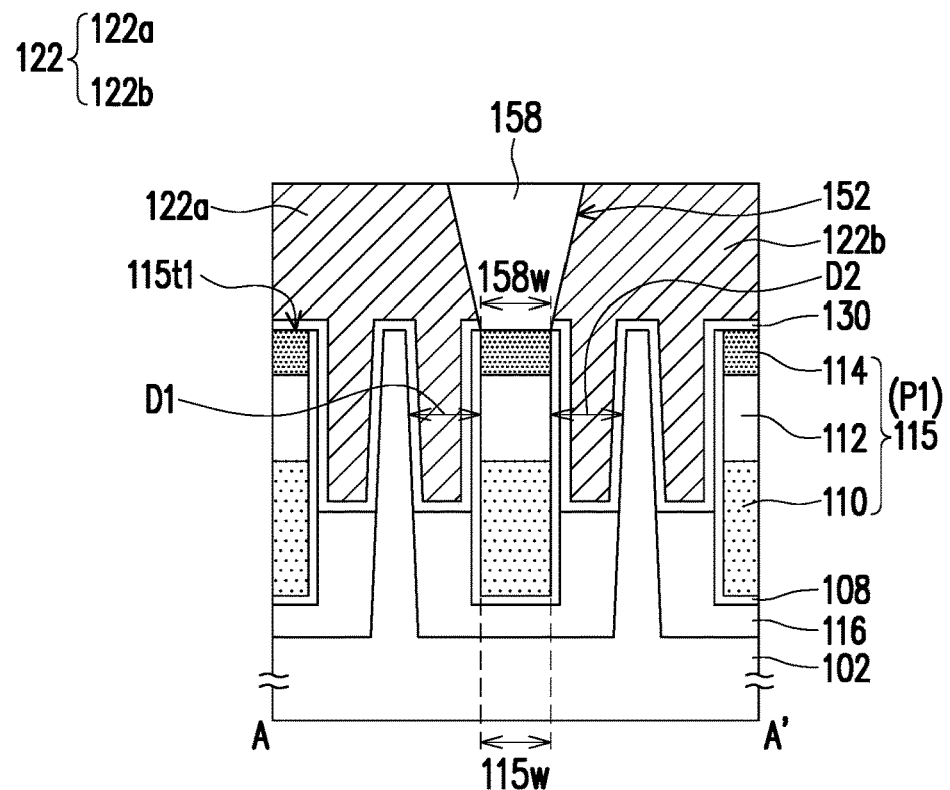
Figure 15B:
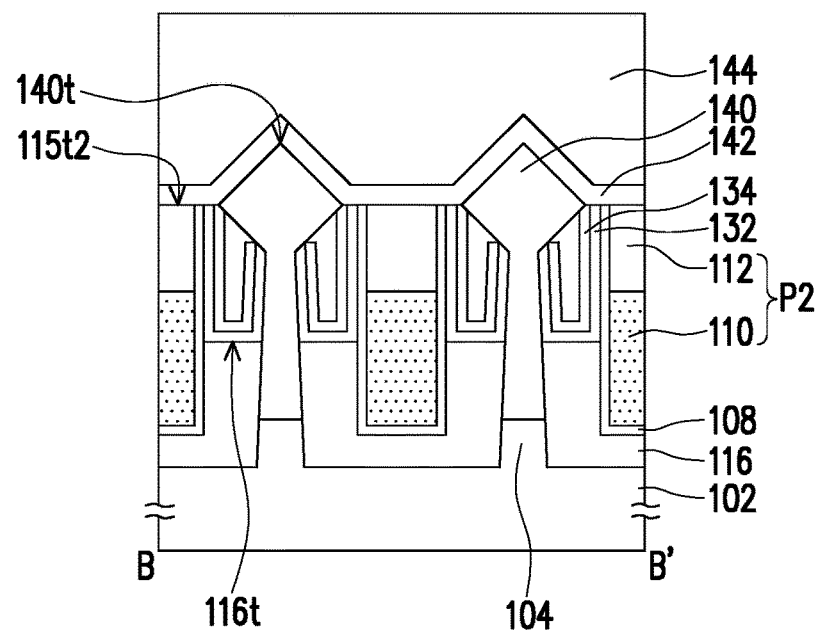

Referring to FIG. 15A to FIG. 15B, a second planarization process may be performed to remove portions of the dielectric material 156 and the mask layer 146, thereby exposing the segments 122*a* and 122*b* of the gate strip 122. In some embodiments, portions of the gate strip 122 and the ILD layer 144 and the dielectric material 156 in the opening 154 (as shown in FIG. 14B) are removed in the second planarization process, so that no dielectric material 156 is shown in the cross-sectional view of FIG. 15B. Alternatively, the dielectric material 156 in the opening 154 may not be completely removed in the second planarization process, the dielectric material 156 in the opening 154 may be removed in following planarization process. After performing the second planarization process, a dielectric structure 158 is formed in the gate strip 122. In some embodiments, the dielectric structure 158 is a pillar structure (hereinafter called as dielectric pillar) landing on the hybrid fin 115. In some embodiments, a bottom width 158*w* of the dielectric structure 158 is less than or equal to the width 115*w* of the hybrid fins 115, so as to enlarge the metal gate filling window and prevent from the shadowing effect in the following gate replacement process. However, the embodiments of the present disclosure are not limited thereto. In other embodiments, the bottom width 158*w* of the dielectric structure 158 is greater than the width 115*w* of the hybrid fins 115.

It should be noted that, as shown in FIG. 15A, the segments 122*a* and 122*b* are separated and electrically isolated by the hybrid fin 115 and the dielectric pillar 158 standing thereon. The hybrid fins 115 may be beneficial to reduce the aspect ratio for the opening 152, and then reduce the removing amount of the gate strip 122 for forming the opening 152 and the critical dimension (CD) of the opening 152, thereby improving endcap patterning window. With the hybrid fin 115, the CD of the opening 152 and/or the width 158*w* of the dielectric pillar 158 have the opportunity to be smaller. That is, the CD and/or width 115*w* of the hybrid fin 115 is smaller than the width of the dielectric pillar without hybrid fin structure in the traditional case. Hence, the endcap patterning window will be larger than the traditional case.

Further, as shown in FIG. 15B, the second portions P2 of the hybrid fins 115 are disposed between the S/D regions 140 to prevent adjacent S/D regions 140 from merging. Since the top surfaces 115t2 of the second portions P2 are lower than the top surfaces 140t of the S/D regions 140, S/D contacts (not shown) is able to land on the S/D regions 140 without being blocked by the second portions P2. That is, the S/D contact and a respective S/D region 140 may have a maximum contact area therebetween to decrease the contact resistance, thereby enhancing the device performance.

Figure 18A:
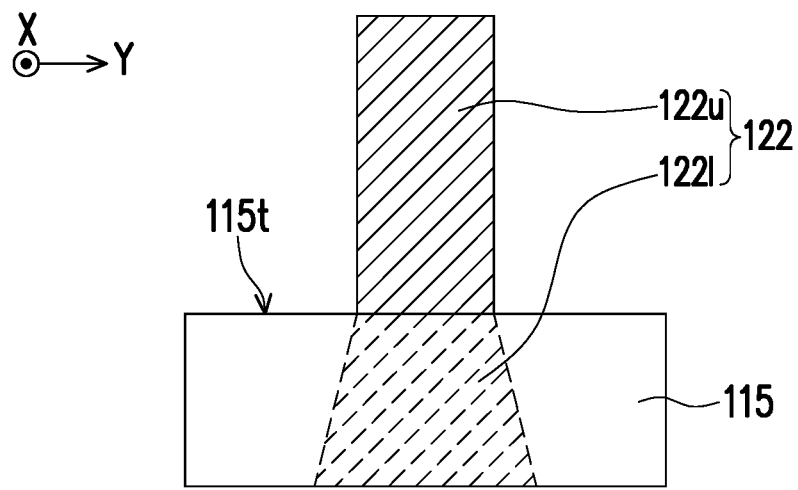
FIG. 18A and FIG. 18B are a schematic cross-sectional view taken along the Y direction of a semiconductor device in accordance with some embodiments of the disclosure.
Figure 18B:
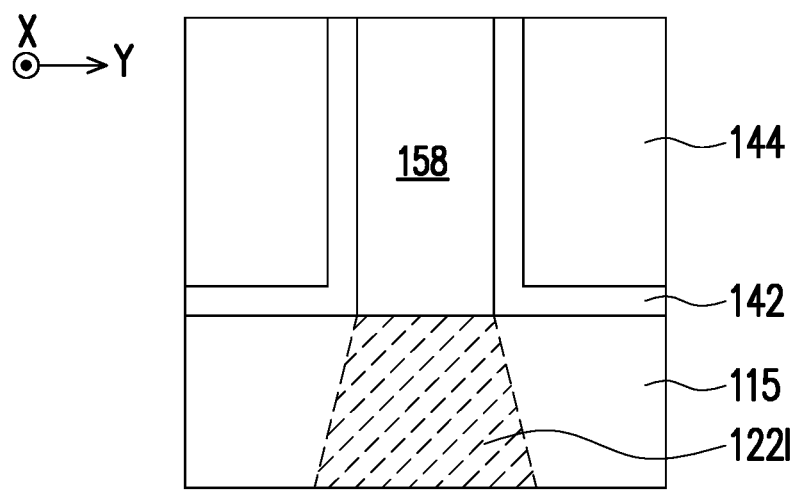
Figure 19A:
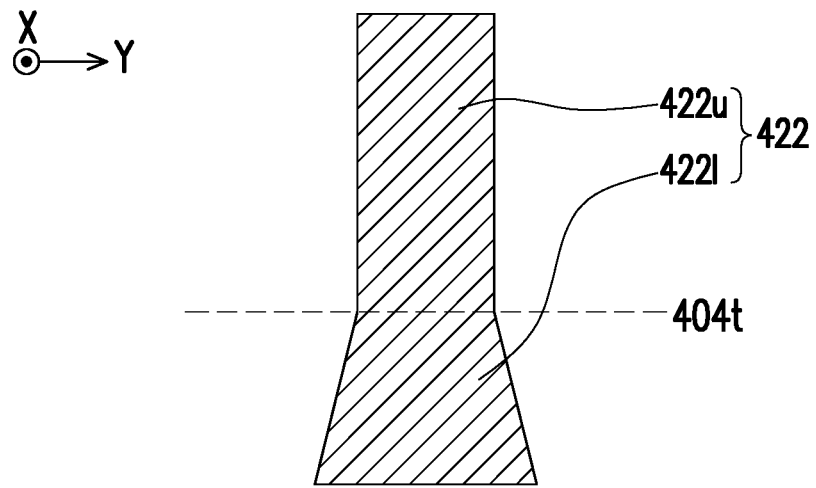
FIG. 19A and FIG. 19B are schematic cross-sectional views taken along the Y direction of a semiconductor device in accordance with some alternative embodiments of the disclosure.
Figure 19B:
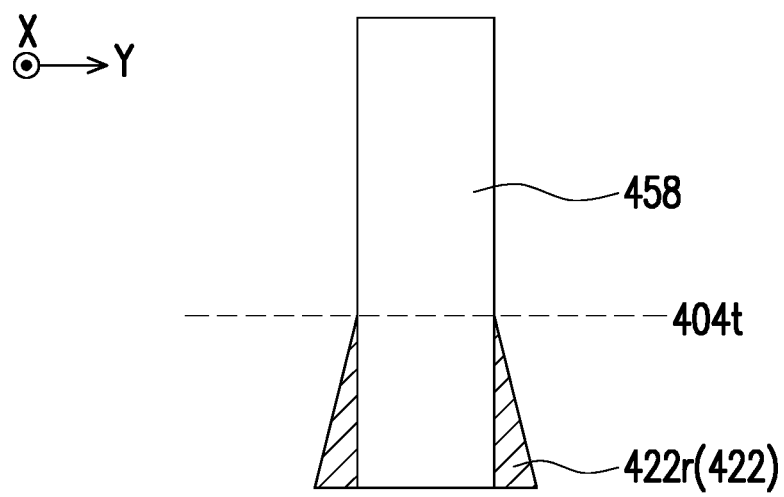

Moreover, the hybrid fins 115 are strips along the Y direction and provide a better isolation separating lower portions of the gate strips 122. Specifically, in some embodiments, the gate strip 122 is divided into a lower portion 122l with a trapezoidal shape and an upper portion 122u with a rectangle shape by the top surface 115t of the hybrid fin 115, as shown in FIG. 18A. The lower portion 122l has a wider bottom area than the upper portion 122u thereof. In the present embodiment, the wider lower portion 122l of the gate strip 122 are separated by the hybrid fin 115 extending along the Y direction, and the narrower upper portion 122u of the gate strip 122 is divided by the dielectric pillar 158 landing on the hybrid fin 115, as shown in FIG. 18B. Accordingly, the gate strip 122 may be cut completely, while the dielectric pillar 158 maintain the smaller critical dimension. Since the lower portion 122l is located at both sides of the hybrid fin 115 and separated by the hybrid fin 115, the lower portion 122l illustrated in the cross-sectional view of FIG. 18B is shown as a dotted line. This means that the lower portion 122l is not disposed in the hybrid fin 115 and is completely cut by the hybrid fin 115. In another case of with no hybrid fin, a gate strip 422 is divided into a lower portion 422l with a trapezoidal shape and an upper portion 422u with a rectangle shape by the fin top 404t, as shown in FIG. 19A. In some embodiment, the fin top 404t is substantially coplanar with the top surface 115t of the hybrid fin 115. Thereafter, the gate strip 422 is cut by the dielectric structure (also called CPO) 458, as shown in FIG. 19A and FIG. 19B. However, the CPO 458 cannot cut the lower portions of the gate strips 422 completely. In the case, as shown in FIG. 19B, the poly residue 422r remains at the corner of the gate strip 422 that result in the gate undercut fail and the short issue between the segments of the gate strip 422. In the present embodiment, the structure of FIG. 15A having the dielectric pillars 158 landing on the hybrid fins 115 is able to solve the said short issue and provide the better isolation.

After forming the dielectric pillars 158, the gate strip 122 and the dielectric layer 130 under the gate strips 122 are removed to be replaced with a gate dielectric layer and a metal gate by the conventional gate replacement process, and thus details thereof are omitted herein.

Figure 16:
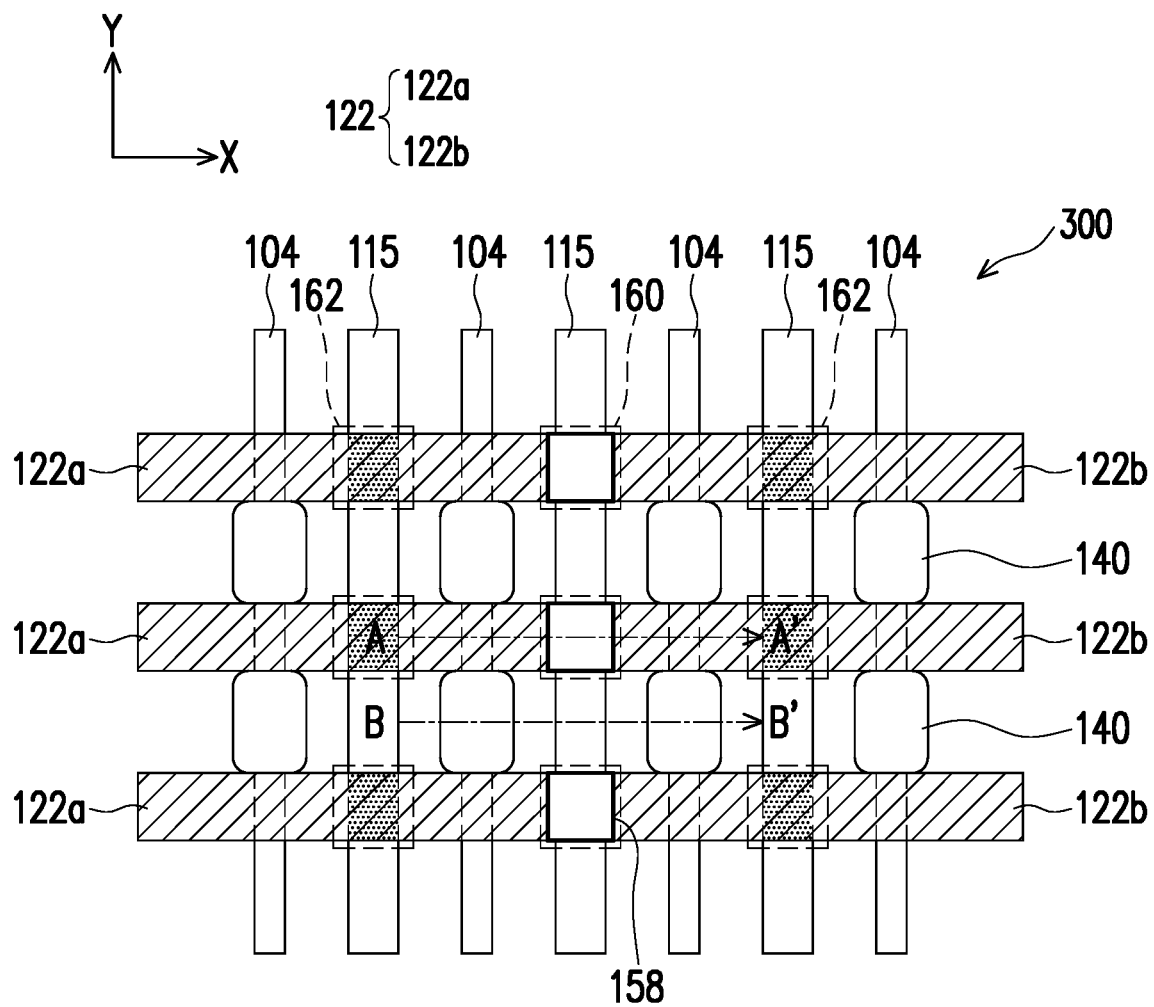
FIG. 16 is a schematic top view illustrating a semiconductor device in accordance with some embodiments of the disclosure.

FIG. 16 is a schematic top view illustrating a semiconductor device in accordance with some embodiments of the disclosure.

From the top view of FIG. 16, a semiconductor device 300 may include a plurality of fins 104, a plurality of hybrid fins 115, a plurality of gate strips 122, a plurality of dielectric pillars 158, and S/D regions 140. The fins 104 extend along the Y direction and are arranged alternately along the X direction. The hybrid fins 115 also extend along the Y direction and are respectively disposed between the fins 104. The gate strips 122 are across portions of the fins 104 and the hybrid fins 115. In some embodiments, the gate strips 122 intersect with the hybrid fins 115 to form a plurality of first overlaps 160 and a plurality of second overlaps 162. The first and second overlaps 160 and 162 may be arranged into an array. The dielectric pillars 158 are embedded in the gate strips 122 and landing on the hybrid fins 115 at the first overlaps 160, so as to divide the gate strips 122 into a plurality of segments 122a and 122b. That is, the hybrid fins 115 and the dielectric pillars 158 landing thereon electrically isolate the segments 122a and 122b. In some embodiments, the segments 122a and 122b are within different active regions. In the case, the dielectric pillars 158 may be referred to as cut-poly (CPO) disposed at edges of poly. In addition, the segments 122a and 122b cover and are across the hybrid fins 115 at the second overlaps 162 respectively. The S/D regions 140 are disposed respectively on the fins 104 at opposite sides of the gate strips 122.

Figure 17:
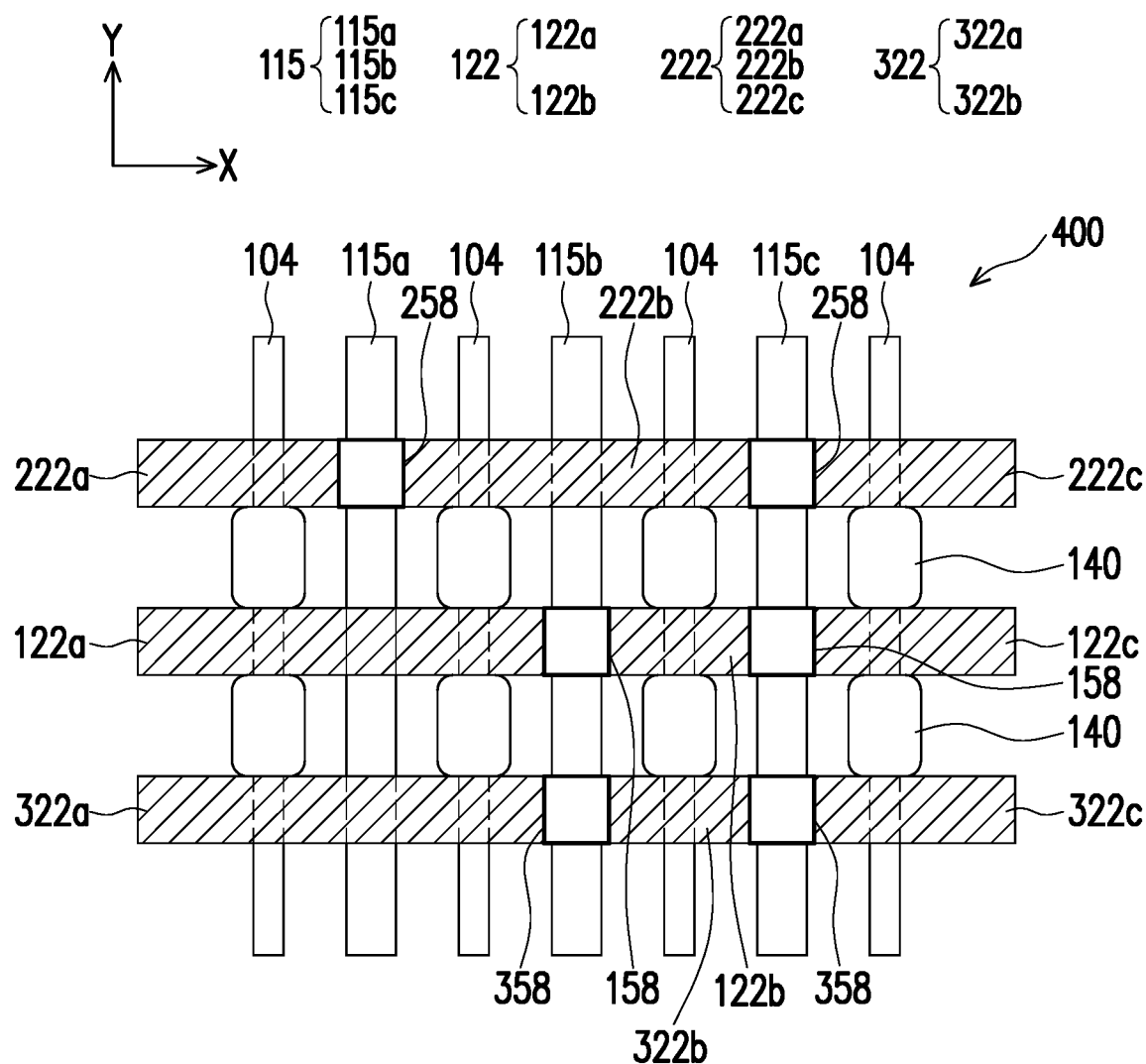
FIG. 17 is a schematic top view illustrating a semiconductor device in accordance with some alternative embodiments of the disclosure.

FIG. 17 is a schematic top view illustrating a semiconductor device in accordance with some alternative embodiments of the disclosure.

Referring to FIG. 17, a semiconductor device 400 is similar to the semiconductor device 300 illustrated in FIG. 16, that is, the structures, materials, and configurations of the semiconductor device 400 are similar to those of the semiconductor device 300, and thus the details are omitted herein. The main difference therebetween lies in that the semiconductor device 400 further comprises a plurality of dielectric pillars 158, 258, and 358 landing on different hybrid fins 115a, 115b, 115c. In detail, in FIG. 17, the dielectric pillars 258 land on the hybrid fins 115a and 115c to divide the gate strips 222 into at least three segments 222a, 222b, and 222c. The dielectric pillars 158 land on the hybrid fins 115b and 115c to divide the gate strips 122 into at least three segments 122a, 122b, and 122c with different lengths. The dielectric pillars 358 land on the hybrid fins 115b and 115c to divide the gate strips 322 into at least three segments 322a, 322b, and 322c with different lengths. On the other hands, in FIG. 16, the dielectric pillars 158 land on the same hybrid fin 115 to divide the gate strips 122 into at least two segments 122a and 122b with the same length. That is, in some embodiments, the dielectric pillars may land on the same or different hybrid fins according to design needs to adjust the number and the configuration of the segments of the gate strips or the active regions.

According to some embodiments, a semiconductor device includes: a substrate comprising at least two fins; one hybrid fin disposed between the at least two fins; a gate covering portions of the at least two fins and the hybrid fin; and a dielectric structure landing on the hybrid fin to divide the gate into two segments, wherein the two segments are electrically isolated by the dielectric structure and the hybrid fin. The hybrid fin includes: a first portion, disposed between the two segments of the gate; and a second portion, disposed aside the first portion, wherein a top surface of the second portion is lower than a top surface of the first portion.

According to some embodiments, a fin field effect transistor (FinFET), includes: a substrate comprising at least two fins; an isolation region disposed on the substrate between the at least two fins; one hybrid fin embedded in the isolation region, wherein the hybrid fin is separated from the substrate by the isolation region; a gate strip across portions of the at least two fins and the hybrid fin, wherein the gate strip intersect with the hybrid fin to form an overlap; and a dielectric pillar landing on the hybrid fin at the overlap to divide the gate strip into two segments.

According to some embodiments, a fin field effect transistor (FinFET), includes: at least one gate strip extending along a first direction; and at least one hybrid structure across a portion of the at least one gate strip. The at least one hybrid structure includes: a bottom strip extending along a second direction; and a protrusion disposed on a top surface of the bottom strip at an overlap between the at least one gate strip and the bottom strip. The at least one gate strip is divided into two segments by the at least one hybrid structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a substrate comprising at least two fins;
one hybrid fin disposed between the at least two fins;
a gate covering portions of the at least two fins and the hybrid fin; and
a dielectric structure landing on the hybrid fin to divide the gate into two segments, wherein the two segments are electrically isolated by the dielectric structure and the hybrid fin, wherein the hybrid fin comprises:
a first portion, disposed between the two segments of the gate; and
a second portion, disposed aside the first portion, wherein a top surface of the second portion is lower than a top surface of the first portion.

2. The semiconductor device of claim 1, further comprising:
an isolation region disposed on the substrate between the at least two fins, wherein a top surface of the isolation region is lower than top surfaces of the at least two fins; and
source/drain (S/D) regions disposed on the at least two fins at opposite sides of the gate.

3. The semiconductor device of claim 2, wherein the second portion electrically isolates two adjacent S/D regions from each other and the top surface of the second portion is lower than top surfaces of the S/D regions.

4. The semiconductor device of claim 2, wherein the hybrid fin comprises:
a first material, partially embedded in the isolation region; and
a second material, disposed on the first material.

5. The semiconductor device of claim 4, wherein the hybrid fin further comprises a third material disposed on the second material and the dielectric structure lands on the third material.

6. The semiconductor device of claim 5, wherein the second material is disposed between the first material and the third material, and the second material has a greater dielectric constant than the first and third materials.

7. The semiconductor device of claim 2, further comprising an interlayer dielectric (ILD) layer disposed on the S/D regions and abutted to the gate, wherein the dielectric structure has a greater dielectric constant than the ILD layer.

8. The semiconductor device of claim 1, wherein the dielectric structure has a bottom surface in direct contact with a top surface of the first portion.

9. A fin field effect transistor (FinFET), comprising:
a substrate comprising at least two fins;
an isolation region disposed on the substrate between the at least two fins;
one hybrid fin embedded in the isolation region, wherein the hybrid fin is separated from the substrate by the isolation region;
a gate strip across portions of the at least two fins and the hybrid fin, wherein the gate strip intersect with the hybrid fin to form an overlap; and
a dielectric pillar landing on the hybrid fin at the overlap to divide the gate strip into two segments.

10. The FinFET of claim 9, wherein the hybrid fin comprises:
a first material, partially embedded in the isolation region; and
a second material, disposed on the first material.

11. The FinFET of claim 10, wherein the hybrid fin further comprises a third material disposed on the second material and in contact with the dielectric pillar.

12. The FinFET of claim 11, wherein the second material is disposed between the first material and the third material, and the second material has a greater dielectric constant than the first and third materials.

13. The FinFET of claim 9, wherein the hybrid fin has an uneven top surface.

14. The FinFET of claim 9, wherein the hybrid fin comprises:
a first portion, disposed between the two segments of the gate strip; and
a second portion, disposed aside the first portion, wherein a top surface of the second portion is lower than a top surface of the first portion.

15. A fin field effect transistor (FinFET), comprising:
at least one gate strip extending along a first direction; and
at least one hybrid structure across the at least one gate strip, wherein the at least one hybrid structure comprises:
a bottom strip extending along a second direction; and
a protrusion disposed on the bottom strip at an overlap between the at least one gate strip and the bottom strip,
wherein the at least one gate strip is divided into two segments by the at least one hybrid structure.

16. The FinFET of claim 15, further comprising:
at least one semiconductor fin extending along the second direction and disposed in parallel aside the at least one hybrid structure;
an isolation region disposed between adjacent semiconductor fins, so that the at least one hybrid structure embedded in the isolation region; and
source/drain (S/D) regions disposed on the at least one semiconductor at opposite sides of the at least one gate strip.

17. The FinFET of claim 6, wherein the bottom strip of the at least one hybrid structure comprises:
a first material, partially embedded in the isolation region; and
a second material, disposed on the first material.

18. The FinFET of claim 17, wherein the protrusion of the at least one hybrid structure at least comprises: a third material disposed on the second material, so that the second material is disposed between the first material and the third material, and the second material has a greater dielectric constant than the first and third materials.

19. The FinFET of claim 18, wherein the protrusion of the at least one hybrid structure further comprises: a fourth material disposed on the third material, wherein the fourth material has a top width greater than a bottom width thereof.

20. The FinFET of claim 15, wherein the first direction is substantially perpendicular to the second direction.

* * * * *